US007259228B2

(12) United States Patent
Vanderzande et al.

(10) Patent No.: US 7,259,228 B2
(45) Date of Patent: Aug. 21, 2007

(54) METHOD OF PREPARING DERIVATIVES OF POLYARYLENE VINYLENE AND METHOD OF PREPARING AN ELECTRONIC DEVICE INCLUDING SAME

(75) Inventors: Dirk Vanderzande, Hasselt (BE); Laurence Lutsen, Coudekerque-Branche (FR); Anja Henckens, Neerpelt (BE); Kristof Colladet, Hasselt (BE)

(73) Assignees: Interuniversitair Microelektronica Centrum (IMEC), Leuven (BE); Limburgs Universitair Centrum, Diepenbeek (BE)

( * ) Notice: Subject to any disclaimer, the term of this patent is extended or adjusted under 35 U.S.C. 154(b) by 209 days.

(21) Appl. No.: 10/971,784

(22) Filed: Oct. 21, 2004

(65) Prior Publication Data

US 2005/0159581 A1  Jul. 21, 2005

(30) Foreign Application Priority Data

Oct. 22, 2003  (EP)  .................................. 03447264

(51) Int. Cl.
  *C08G 75/00*  (2006.01)
(52) U.S. Cl. ...................... 528/390; 528/391; 528/373; 528/377; 528/489; 528/492; 528/503; 428/690; 428/917
(58) Field of Classification Search ................ 528/390, 528/391, 373, 377, 489, 503, 492; 428/690, 428/917
See application file for complete search history.

(56) References Cited

U.S. PATENT DOCUMENTS

| 3,401,152 | A | 9/1968 | Wessling |
| 5,247,190 | A | 9/1993 | Bradley et al. |
| 5,621,069 | A | 4/1997 | Galvin-Donoghue et al. |
| 5,817,430 | A | 10/1998 | Hsieh |
| 2003/0027963 | A1 | 2/2003 | Ten Hoeve et al. |

FOREIGN PATENT DOCUMENTS

| EP | 0 707 022 A2 | 4/1996 |
| EP | 0707022 A | 4/1996 |
| JP | 50-004732 | 1/1975 |
| WO | WO90/13148 A | 11/1990 |
| WO | WO 01/92369 | 12/2001 |

OTHER PUBLICATIONS

Kesters et al., "Polymerization—analytical techniques", Macromolecules, 35(21), 7902-7910, 2002, Chem Abstract 137: 325738.*
Mitchell et al; Thermal routes to low HOMO-LUMO energy gap poly(arylene vinylene)s, Journal of Materials Chemistry, 12(2), 200-205, 2002, Chem Abstract 136: 355549.*

Keil et al, "Thermal—PPV derivatives", Polymer Preprints (American Chemical Society, Division of POlymer Chemistry), 41(1), 826-827, 2000, Chem Abstract 132: 348028.*
Toyoshima, et al., "Synthesis and Properties of Poly(thienylenevinylene) Derivatives With Hexyl Groups", Synthetic Metals, Elsevier, Sequoia, Lausanne, CH, vol. 84, No. 1-3, Jan. 1, 1997, pp. 431-432.
Saito, et al., "Synthesis of Soluble Polyarylene Vinylenes etc.", Macromolecules, vol. 4528, No. 24, Nov. 20, 1995, pp. 8363-8383.
European Search Report in Application No. EP 03 44 7264, completed Apr. 22, 2004.
Wessling, et al., *The Polymerization of Xylylene Bisdialkyl Sulfonium Salts*, J. Polym. Sci.: Polym. Symp. 1985, 72, pp. 55-56.
Murase, et al., *Highly Conducting Ply (2.5-thienylene Vinylene via a Precursor Route*, J. Chem. Soc., Chem. Commun. 1987, pp. 229-231.
Yamada, et al. *New Conducting Polymer Film: Poly (2.5-thienylenevinylene) Prepared via a Soluble Precursor Polymer*, J. Chem. Soc. Chem. Comm. , 1987, pp. 1448-1449.

(Continued)

*Primary Examiner*—Duc Truong
(74) *Attorney, Agent, or Firm*—Knobbe Martens Olson & Bear LLP

(57) ABSTRACT

A technique is described for the preparation of polymers according to a process in which the starting compound of formula (I) is polymerized in the presence of a base in an organic solvent. No end chain controlling agents are required during the polymerization to obtain soluble precursor polymers. The precursor polymer such obtained comprises structural units of the formula (II). In a next step, the precursor polymer (II) is subjected to a conversion reaction towards a soluble or insoluble conjugated polymer by thermal treatment. The arylene or heteroarylene polymer comprises structural units of the formula III. In this process the dithiocarbamate group acts as a leaving group and permits the formation of a precursor polymer of structural formula (II), which has an average molecular weight from 5000 to 1000000 Dalton and is soluble in common organic solvents. The precursor polymer with structural units of formula (II) is thermally converted to the conjugated polymer with structural formula (III)

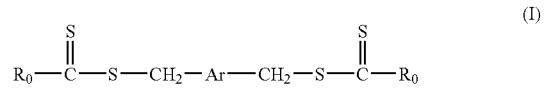

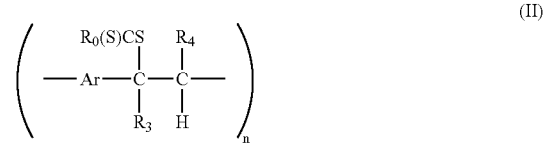

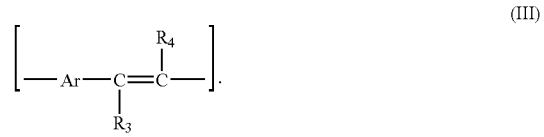

14 Claims, No Drawings

OTHER PUBLICATIONS

Jen, et al., *Low Band—Gap Conjugated Polymers: Poly (Thienylene Vinylene) and Poly (Substituted Thienylene Vinylenes)*, Mol. Cryst. Liq. Cryst. 1990, 186, pp. 211-222.

Van Breeman, et al., *Optimization of the Polymerization Process Of Sulfinyl Precursor Polymers Toward Poly*, Macromolecules 1999, 32(18), pp. 5728-5735.

Lo, et al., *Control of Polymer-Electrode interactions: The Effect of Leaving Group on the Optical Properties and Device Characteristics of EHPPV*, J. Mater. Chem. 2001, 11, pp. 2228-2231.

Otsu, et al., *Living Mono-and Biradical Polymerizations in Homogeneous System Synthesis of AB and ABA Type Block Copolymers*, Polym. Bull. 1984, 11(2), pp. 135-142.

Otsu, T., *Iniferter Concept and Living Radical Polymerization*, J. Polym. Sci., Part A: Polym. Chem. 2000, 38(12), pp. 2121-2136.

Saito, Hiroki, et al. Synthesis of Soluble Poly(arylenevinylene)s Carrying Various Heterocycles as Arylene Units. Macromolecules, Nov. 20, 1995, Washington, U.S.

Toyoshima, R., et al. Synthesis and properties of poly(thienylenevinylene) derivatives with hexyl groups. Synthetic Metals 84 (1997).

European Search Report, dated Oct. 13, 2006, in corresponding EP Application No. 04447233.0.

* cited by examiner

METHOD OF PREPARING DERIVATIVES OF POLYARYLENE VINYLENE AND METHOD OF PREPARING AN ELECTRONIC DEVICE INCLUDING SAME

TECHNICAL FIELD OF THE INVENTION

The present invention relates to a method for the preparation of soluble precursor polymers of arylene and heteroarylene vinylene polymers and their conversion towards arylene and heteroarylene vinylene polymers, and to devices including the same.

BACKGROUND OF THE INVENTION

Conjugated polymers are of great interest for the development of optical and electronic applications. The most investigated conjugated polymers are poly(thiophene) (PT) and poly(p-phenylene vinylene) (PPV). Also poly(2,5-thienylene vinylene) (PTV) has attracted great attention because of its high electrical conductivity upon doping and its possible application as a semiconductor in all-polymer field effect transistors. Additionally, PTV is a low band gap semiconductor polymer, which makes it a very interesting material for organic photovoltaic devices.

Several methods have been developed to synthesize PTV. In the early days, PTV was synthesised via the Wessling polymerization method, which is described in U.S. Pat. No. 3,401,152 by R. A. Wessling and R. G. Zimmerman and in J. Polym. Sci.: Polym. Symp. 1985, 72, 55 by R. A. Wessling. The polymerization reaction according to the Wessling method is difficult, because the products tend to form a gel. Moreover, strong acids, which could be toxic, are required during the conversion reaction.

In 1987, Murase et al. and Yamada et al. reported the synthesis of PTV via a precursor polymer with methoxy leaving groups (I. Murase, T. Ohnishi, T. Noguchi, M. Hirooka, Polym. Commun. 1987, 28, 229; S. Yamada, S. Tokito, T. Tsutsui, S. Saito, J. Chem. Soc., Chem. Commun. 1987, 1448). This reaction is an acid catalysed conversion reaction, which is incompatible with device fabrication.

In 1990, Elsenbaumer et al. reported the synthesis and characterisation of PTV and some alkyl-substituted PTV's (R. L. Elsenbaumer, Mol. Cryst. Liq. Cryst 1990, 186, 211). These methods are far from ideal especially for the PTV derivatives due to the relative high reactivity of the monomer and precursor polymer which complicates both monomer and polymer synthesis. The high reactivity is originated from the high electron density of the thiophene ring, which induces a very high instability of the starting monomer when this monomer is reached but generally with low reproducibility and very low yields due to many side-reactions.

This is also the reason why problems occur by using the more recent precursor methods like the sulfinyl route, developed by Vanderzande et al. in 1997 (A. J. J. M. Van Breemen, A. C. J. Issaris, M. M. de Kok, M. J. A. N. Van Der Borght, P. J. Adriaensens, J. M. J. V. Gelan, D. J. M. Vanderzande, Macromolecules 1999, 32, (18), 5728), the bis-xanthate route developed by Son in. 1995 and Burn et al. in 2001 and described in (U.S. patent 1997/5,621,069; European patent EP 0 707 022 A2; S-C. Lo, L.-O. Palsson, M. Kilitziraki, P. L. Burn, I. D. W. Samuel, J. Mater. Chem. 2001, 11, 2228) and the bis-sulfide route developed by Herwig et al in 2003 (U.S. patent 2003/0027963 A1).

To use PTV, other poly(arylene vinylene)s and poly (heteroarylene vinylene) derivatives in plastic electronics, an easy accessible precursor polymer that can be manufactured on a large scale is desirable.

SUMMARY OF THE INVENTION

It is an object to provide a method for the synthesis of soluble or insoluble conjugated polymers like arylene of heteroarylene vinylene, optionally in good yields, optionally with high molecular weight, optionally good quality, e.g. low defect level and optionally in large scale. It is a further aim to describe the use of these soluble or insoluble conjugated polymers for organic solar cells, organic transistors and other kinds of electronic devices.

It is a further aim to describe a novel precursor polymer, to be used as intermediate compound in the synthesis of arylene of heteroarylene vinylene polymers.

In a first aspect, a method for the preparation of a precursor polymer is disclosed. The precursor polymer has the general formula

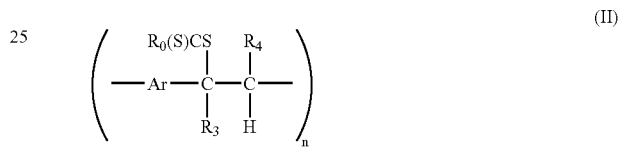

(II)

wherein Ar is an aromatic divalent group or a heteroaromatic divalent group, wherein $R_0$ is an organic group selected from the group consisting of an amine —$NR_1R_2$, a $C_5$-$C_{20}$ alkyloxy group, an aryloxy group, an alkyl group, an aryl group, an alkylaryl group, an arylalkyl group, a thioether group, an ester group, an acid carboxylic group, and a heterocyclic group, and wherein $R_3$ and $R_4$ are independently from each other hydrogen or an organic group selected from the group consisting of a $C_1$-$C_{20}$-alkyl group, a cyclic $C_3$-$C_{20}$-alkyl group, an aryl group, an alkylaryl group, an arylalkyl group, a thioether group, an ester group, an acid carboxylic group and a heterocyclic group, and wherein n is the number of repeating units.

In a specific embodiment, the precursor polymer may have the formula as formula (II) wherein $R_0$ is an amine —$NR_1R_2$

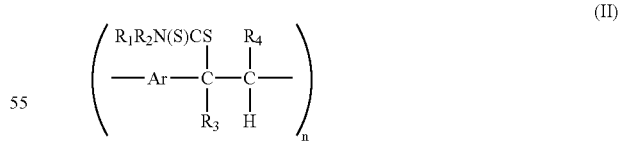

(II)

and in which $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, $R_1$ and $R_2$ may be linked together to form a cycle. One typical example of such a precursor polymer may be a precursor polymer wherein $R_0$=—$NR_1R_2$ and wherein $R_1$=$R_2$=Et:

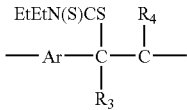

In other specific examples of precursor polymers which may be used in embodiments, $R_0$ may be a phenyl group, a methyl group or a group ($F_6C_6O$):

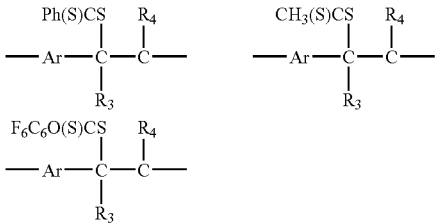

In further specific examples, precursor polymers may be used which are based on poly(p-phenylene vinylene) derivatives, such as for example alkoxy poly(p-phenylene vinylene) (alkoxy-PPV) derivatives such as e.g. precursor polymers based on poly(2-methoxy,5-3',7'-dimethyloctyloxy)-1,4-phenylene vinylene (MDMO—PPV or $OC_1C_{10}PPV$), or based on poly(p-thienylene vinylene) (PTV) derivatives.

A method comprises the steps of:
providing a monomer having the general formula:

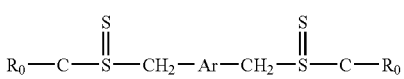
(I)

wherein Ar is an aromatic divalent group or a heteroaromatic divalent group, wherein $R_0$ is an organic group selected from the group consisting of an amine —$NR_1R_2$, a $C_5$-$C_{20}$ alkyloxy group, an aryloxy group, an alkyl group, an aryl group, an alkylaryl group, an arylalkyl group, a thioether group, an ester group, an acid carboxylic group, and a heterocyclic group, and
reacting said monomer with a basic compound in the presence of an organic solvent to obtain said precursor polymer,
hereby not requiring the use of a chain end controlling additive.

In a specific embodiment, a monomer may be provided, having the formula according to formula (I), wherein $R_0$ is an amine —$NR_1R_2$, in which $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, $R_1$ and $R_2$ may be linked together to form a cycle.

The basic compound may be selected from the group consisting of a metal oxide, a metal alkoxide, a metal amide, organometal compounds, grignard reagents and ammonium hydroxide. The amount of basic compound may be between 1 and 2 equivalents with respect to the monomer.

The concentration of the monomer used in the method may be between 0.1 and 0.3 M.

In an embodiment of the first aspect, the Ar group may be an aromatic divalent group with 4 to 20 carbon atoms which may be substituted with one or more substituents independently selected from the group consisting of $C_1$-$C_{20}$-alkyl, $C_3$-$C_{20}$-alkoxy or $C_1$-$C_{20}$-alkylsulfate, poly(ethylene oxide) (PEO) or oligo(ethylene oxide), poly(ethylene glycol) (PEG) or oligo(ethylene glycol). These aromatic divalent groups may comprise up to 4 heteroatoms chosen from the group comprising oxygen, sulphur, and nitrogen.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-bi-phenylene; phenantrene-2,7-diyl; 9,10-dihydrophenantrene-2,7-diyl; dibenzofurane-2,7-diyl; dibenzothiophene-2,7-diyl. Preferably, Ar is 1,4-phenylene or 2,5-thienylene and most preferably Ar is 2,5-thienylene.

In a preferred embodiment, $R_1$ and $R_2$ may be a $C_1$-$C_{20}$-alkyl group. In another embodiment, $R_1$ and $R_2$ may be selected from the group consisting of methyl, ethyl and isopropyl.

In a further embodiment of the first aspect, reacting the monomer with a basic compound may be performed at a temperature between $-78°$ C. and $200°$ C., preferably between $-40°$ C. and $120°$ C., and most preferably between $-20°$ C. and $30°$ C. The temperature may be selected such that the average molecular weight of the soluble precursor polymer is as high as possible and that the polydispersity is as low as possible.

The method as described in the first aspect may require symmetrical starting monomers. Symmetrical starting molecules have the advantage that they are easier to synthesise than asymmetric starting monomers. Furthermore, symmetrical starting monomers with dithiocarbamate groups are stable in time. The polymerization of the symmetrical monomer in a solvent and in the presence of a base may lead to a precursor polymer soluble in common organic solvents. Those solvents may be polar, apolar and mixtures thereof. The solvent may for example be an aprotic solvent. The dithiocarbamate groups act as a leaving group and as a polarizer during the polymerization.

Furthermore, an embodiment provides a precursor polymer with the formula:

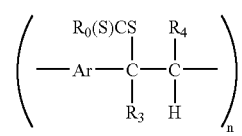
(II)

wherein Ar is an aromatic divalent group or heteroaromatic divalent group, wherein $R_0$ is an organic group selected from the group consisting of an amine —$NR_1R_2$, a $C_5$-$C_{20}$ alkyloxy group, an aryloxy group, an alkyl group, an aryl group, an alkylaryl group, an arylalkyl group, a thioether group, an ester group, an acid carboxylic group or a heterocyclic group. The $C_1$-$C_{20}$-alkyl group, cyclic $C_4$-$C_{20}$-alkyl group, phenyl group and benzyl group may comprise heteroatoms and substituents. In a preferred embodiment, $R_1$ and $R_2$ may independently be selected from methyl, ethyl or propyl. $R_3$ and $R_4$ are chosen from the group comprising a hydrogen atom and a $C_1$-$C_{20}$-alkyl group, a cyclic $C_4$-$C_{20}$-alkyl group, a phenyl group and a benzyl group, which groups may comprise heteroatoms and substituents. In a preferred embodiment, $R_3$ and $R_4$ may be hydrogen. All possible combinations of Ar, $R_0$, $R_1$, $R_2$, $R_3$ en $R_4$ may be included in this invention.

In a specific embodiment, the precursor polymer may have the formula as formula (II) wherein $R_0$ is an amine —$NR_1R_2$:

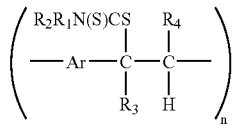

and in which $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, $R_1$ and $R_2$ may be linked together to form a cycle. One typical example of such a precursor polymer may be a precursor polymer wherein $R_0$=—$NR_1R_2$ and wherein $R_1$=$R_2$=Et:

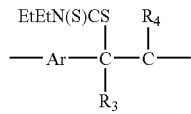

In other specific examples of precursor polymers which may be used in embodiments, $R_0$ may be a phenyl group, a methyl group or a group ($F_6C_6O$):

In other specific examples, precursor polymers may be based on poly(p-phenylene vinylene) derivatives, such as for example alkoxy poly(p-phenylene

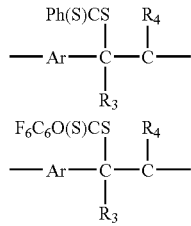

vinylene) (alkoxy-PPV) derivatives such as e.g. poly(2-methoxy,5-3',7'-dimethyloctyloxy)-1,4-phenylene vinylene (MDMO-PPV or $OC_1C_{10}$PPV), or on poly(p-thienylene vinylene) derivatives.

In a preferred embodiment, the Ar group may comprise 4 to 20 carbon atoms. In another embodiment, the Ar groups may be substituted with a substituent chosen from the group consisting of a $C_1$-$C_{20}$-alkyl, $C_3$-$C_{20}$-alkoxy, $C_1$-$C_{20}$-alkylsulfate, poly(ethylene oxide) (PEO) or oligo(ethylene oxide), poly(ethylene glycol) (PEG) or oligo(ethylene glycol), a phenyl or a benzyl group and these Ar groups may comprise up to 4 heteroatoms chosen from the group comprising oxygen, sulphur, and nitrogen in the aromatic cyclic system. In other embodiments, the substituents may be linear, or cyclic or two substituents may be linked together to form a cycle on the Ar groups. In still a further embodiment, the substituents may contain charges, ions, cations or anions.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene or 2,5-thienylene and most preferably Ar may be 2,5-thienylene.

The precursor polymers may show high molecular weight, between 5000 and 500000, more particularly between 7000 and 250000, especially between 7500 and 100000 Dalton. Furthermore, the polydispersity of the precursor polymers may be between 1.5 and 5.5, preferably below 2. The precursor polymer may be obtained in good overall yields in a reproducible way. Large-scale production may be a possibility.

In a second aspect a method for the preparation of soluble or insoluble conjugated arylene and heteroarylene vinylene polymers is disclosed. The method does not require the use of chain end controlling additives. The soluble or insoluble conjugated arylene heteroarylene vinylene polymers have the general formula:

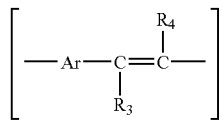

wherein Ar is equal to the Ar group in the first aspect.

The method comprises the steps of:
providing at least one precursor polymer having the general formula:

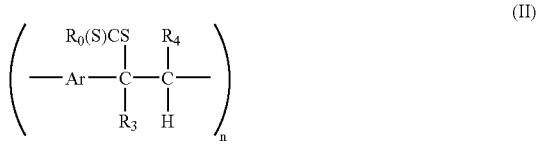

(II)

wherein Ar is an aromatic divalent group or an heteroaromatic divalent group, wherein $R_0$ is an organic group selected from the group consisting of an amine —$NR_1R_2$, a $C_5$-$C_{20}$ alkyloxy group, an aryloxy group, an alkyl group, an aryl group, an alkylaryl group, an arylalkyl group, a thioether group, an ester group, an acid carboxylic group, and a heterocyclic group, and wherein $R_3$ and $R_4$ are independently from each other hydrogen or an organic group selected from the group consisting of a $C_1$-$C_{20}$-alkyl group, a cyclic $C_3$-$C_{20}$-alkyl group, an aryl group, an alkylaryl group, an arylalkyl group, a thioether group, an ester group, an acid carboxylic group and a heterocyclic group, wherein n is the number of repeating units, and subjecting the precursor polymer to a thermal conversion reaction which comprises total or partial elimination of the —SC(S)R₀ groups by thermal treatment at a temperature between 30° C. and 300° C. in solution or in thin film.

In a specific example, a precursor polymer is provided with formula as formula (II) wherein $R_0$ is an amine —$NR_1R_2$:

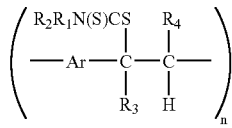

and in which $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, $R_1$ and $R_2$ may be linked together to form a cycle. One typical example of such a precursor polymer may be a precursor polymer wherein $R_0$=—$NR_1R_2$ and wherein $R_1$=$R_2$=Et.

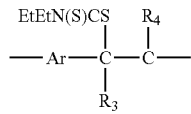

In other specific examples of precursor polymers which may be used in embodiments according to the invention, $R_0$ may be a phenyl group, a methyl group or a group ($F_6C_6O$):

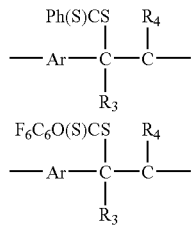

In other specific examples, precursor polymers may be used which are based on poly(p-phenylene vinylene) derivatives, such as for example alkoxy poly(p-phenlyne vinylene) (alkoxy-PPV) derivatives such as e.g. poly(2-methoxy,5-3', 7'-dimethyloctyloxy)-1,4-phenylene vinylene (MDMO-PPV or $OC_1C_{10}$PPV), or on poly(p-thienylene vinylene) derivatives.

The precursor polymer may be synthesized according to the method described in the first aspect. In one embodiment of the second aspect, the duration of the subjecting step may be lower than 24 hours, lower than 8 hours and preferably lower than 3 hours.

In an embodiment of the first aspect, the Ar group may be an aromatic divalent group with 4 to 20 carbon atoms which may be substituted with one or more substituents independently selected from the group consisting of $C_1$-$C_{20}$-alkyl, $C_3$-$C_{20}$-alkoxy, $C_1$-$C_{20}$-alkylsulfate, poly(ethylene oxide) (PEO), poly(ethylene glycol) (PEG), a phenyl group or a benzyl group. These Ar groups may comprise up to 4 heteroatoms chosen from the group comprising oxygen, sulphur, and nitrogen in the aromatic divalent group. Furthermore, these groups may independently be linear, or cyclic or two of these groups may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4 thienylene; 2,3 thienylene; 2,5-furanediyl; 2,5-pyrrolediyl; 1,3,4-oxadiazole-2,5-diyl;. 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar is 1,4-phenylene or 2,5-thienylene and most preferably Ar is 2,5-thienylene.

The conjugated arylene or heteroarylene vinylene polymers may be obtained by thermal conversion of the precursor polymer in which the remaining dithiocarbamate group acts as a leaving group (or evaporating group). The conjugated polymer may show a low structural defect level.

In a preferred embodiment, $R_1$ and $R_2$ may be a $C_1$-$C_{20}$-alkyl group. In another embodiment, $R_1$ and $R_2$ may be selected from the group consisting of methyl, ethyl or propyl.

In a preferred embodiment, $R_1$ and $R_2$ may be a $C_1$-$C_{20}$-alkyl. In another embodiment, $R_1$ and $R_2$ may be selected from the group consisting of methyl, ethyl, propyl or phenyl. In another preferred embodiment, $R_3$ and $R_4$ may be hydrogen.

In a preferred embodiment, said conjugated arylene vinylene polymer is poly (2,5 thienylene vinylene) and its derivatives.

In a further embodiment of the second aspect the precursor polymer may be dissolved in an organic or non-organic solvent and the conversion reaction or elimination reaction may be performed in solution by thermal treatment under inert or controlled atmosphere to lead to a soluble or insoluble conjugated polymer. This method may in generally be used when the conjugated polymer is expected to be soluble in organic and/or non-organic solvents. In a further embodiment according this second aspect the precursor polymer may be in the form of a thin film precursor polymer layer and the conversion or elimination reaction step may be performed under inert or controlled atmosphere or under vacuum by in situ thermal treatment.

In a further embodiment of the second aspect, the precursor polymer may be dissolved in a solvent, followed by a degassing step.

In a further embodiment of the second aspect, the thermal conversion step may be performed at a temperature between 30° C. and 300° C., preferably between 80° C. and 300° C., and most preferably between 115° C. and 250° C.

In a further embodiment of the second aspect the yield of the method may be between 30% and 90%.

Compared to the Wessling route, the method has the advantage of leading to polymerization without gel formation and requiring no toxic gas (like strong acids) during the conversion reaction.

Compared to the Gilch route, an embodiment has the advantages of leading to polymers that can also be insoluble in their conjugated form. The Gilch route is a one-pot polymerization, which only allows the synthesis of soluble conjugated polymers; it is not a precursor route as is the case in this embodiment.

Compared to the sulfinyl route, an embodiment has the advantages of leading to stable monomers.

Compared to the Hsieh method (U.S. Pat. No. 5,817,430), the method does not require the use of chain end controlling additives to control the molecular weight in order to get soluble conjugated polymers. Contrary to the Hsieh method, which is a side chain approach, the method according to an embodiment is a "precursor method" which does not require control of the molecular weight. The resulting precursor polymers are always soluble polymers, whatever their molecular weight is and are soluble even for very high molecular weight. The related conjugated polymer may be obtained in a second step by a conversion or elimination reaction under thermal treatment to lead to soluble or insoluble conjugated polymers. When the conjugated polymer is expected to be insoluble, the elimination reaction may preferably be carried out in thin film. When the conjugated polymer is expected to be soluble, the elimination reaction may be carried out either in solution or in thin film.

Precursor polymers synthesised from a monomer having a symmetrical structure may be much easier to synthesise and to obtain in good yield. No complicated purification step by chromatography column of the monomer is requested.

Precursor polymers with leaving groups (e.g. dithiocarbamate) are compatible with a device application. The lifetime of the device is not influenced by remaining traces of leaving groups in the active layer after the conversion reaction.

During the conversion step, the leaving groups of the precursor polymers are eliminated and double bonds of the conjugated polymer are formed. In one embodiment, substantially all of the leaving groups are eliminated, thus forming a fully converted conjugated polymer. However, in another embodiment, only between 90 and 100% of the leaving groups may be eliminated. Hence, between 0 and 10% of the leaving groups is still present in the resulting conjugated polymer. Thus, the resulting polymer is only partially converted. This polymer will be referred to as partially converted conjugated polymer. The amount of remaining leaving groups in the partially converted conjugated polymer may be controlled by changing the experimental circumstances of the conversion reaction.

Compared to the bis-sulfide route (EP 1 290 059 A1), the method has the advantage of leading to polymers by means of polymerization of monomers which are much more stable and therefore allow the synthesis of polymers for which the instability of the monomers can be a problem to obtain such polymer in a reliable way. In the bis-sulfide route, overoxidation can occur easily as the oxidation of the sulfide groups is carried out after polymerization and not on the starting monomer. Structural defects have a negative effect on the charge mobility of conjugated polymers Compared to the bis-xanthate route, an embodiment has the advantages of leading to:

monomers and soluble precursor polymers stable in time in inert atmosphere.

precursors and conjugated polymers with a much lower polydispersity around 2 to 3 (while being between 20 and 30 for the xanthate-route).

reproducibility between batches.

precursor polymers obtained through polymerization reaction carried out at a temperature ranging from −78° C. to 30° C.

the yield of the polymerization reaction is higher than 50%.

conjugated polymers with low defect level.

polymers with an increase of $\lambda_{max}$ of about 20 nm for a PTV derivative at room temperature synthesised according to an embodiment, compared to the same PTV derivative synthesised via another method. For example, poly(2,5-thienylene vinylene), having no substituent on Ar, has a $\lambda_{max}$ value around 545 nm for PTV at high temperature and 570 nm at room temperature when synthesised according to the method of an embodiment compared to the same poly(2,5-thienylene vinylene) having no substituents on Ar which has a $\lambda_{max}$ value around 500-520 nm at high temperature when synthesised via the xanthate-route and the $\lambda_{max}$ value may be varied from batch to batch.

large-scale synthesis is possible.

Furthermore, an embodiment provides a conjugated arylene or heteroarylene vinylene polymer with the general formula:

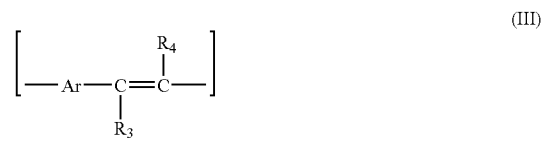

(III)

wherein Ar is an aromatic group or an heteroaromatic divalent group, wherein $R_3$ and $R_4$ are independently from each other hydrogen or an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, and wherein n is an integer from 5 to 2000 and which are formed with the method according to an embodiment.

In a preferred embodiment, Ar comprises 4 to 20 carbon atoms. In another embodiment, the Ar groups may be substituted with a substituent chosen from the group consisting of a $C_1$-$C_{20}$-alkyl, $C_3$-$C_{20}$-alkoxy, $C_1$-$C_{20}$-alkylsulfate, poly(ethylene oxide) (PEO), poly(ethylene glycol) (PEG), a phenyl or a benzyl group and the Ar groups may comprise up to 4 heteroatoms chosen from the group comprising oxygen, sulphur, and nitrogen in the aromatic cyclic system.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-diyl; 1,3, 4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene or 2,5-thienylene and most preferably Ar may be 2,5-thienylene.

All possible combination of Ar, $R_0$, $R_1$, $R_2$, $R_3$ and $R_4$ are included in this invention.

The conjugated polymers, prepared according to a method described in the previous embodiments has less defects with respect to the prior art.

In a specific, preferred embodiment, the conjugated arylene or heteroarylene vinylene polymer is a poly(2,5-thienylene vinylene) or PTV polymer with formula:

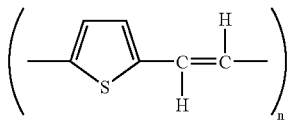

Due to the fact that the polymer is prepared by the method as described herein, the poly(2,5-thienylene vinylene) polymer shows a peak at a wavelength higher than 520 nm in the absorption spectrum.

In another embodiment, also other PTV derivatives, which have side chains on the 2 and 3 positions (instead of on the 2 and 5 positions in the previous embodiment) on the thiophene ring may be used.

In a preferred embodiment, the polymer may be characterized by a peak at a wavelength higher than 540 nm in the absorption spectrum.

The average molecular weight of the polymer may be between 5000 daltons and 500000 daltons, whereas the polydispersity may be between 1.5 and 5.5. Furthermore, the polymer may be a linear polymer.

The method according to an embodiment does not require the use of a chain end controlling additive.

In an embodiment at least two monomers having formula (I) may be polymerised together to form a copolymer.

In a third aspect, an electronic device is provided. The electronic device comprises a thin layer of conjugated polymer synthesised according to an embodiment and having the formula (III). Ar, $R_3$ and $R_4$ are equal to Ar, $R_3$ and $R_4$ as described in the first and the second aspect. The electronic device according to the third aspect has several advantages. The polymers were found to have less defects. As a result, the polymer has better properties, resulting in a better electronic device.

In a first embodiment of the third aspect, the device may be a light-emitting diode. The light-emitting diode may comprise polymers having structural units of formula (III). Preferably, Ar may be 1,4-phenylene or 2,5-thienylene while $R_3$ and $R_4$ may be hydrogen.

In a further embodiment, the device may be a circuit or organic transistor. The integrated circuit may comprise polymers having structural units of formula (III), wherein Ar preferably may be 1,4-phenylene or 2,5-thienylene while $R_3$ and $R_4$ may be hydrogen. Such integrated circuits have the advantage of having a lower cost price. According to an embodiment, the device may also be a chemical sensor or a biological sensor The invention further relates to a method of manufacturing a layer of a polymer with structural units having the formula (II) or (III).

An embodiment further relates to a method of manufacturing bilayer heterojunction organic solar cells using a soluble precursor polymer containing structural units of formula (II). The active layer made from the soluble precursor polymer may become effectively active only after conversion reaction towards the related soluble or insoluble conjugated polymer by an elimination reaction under heat treatment in situ in thin film.

Furthermore, an embodiment relates to a method of manufacturing organic bulk heterojunction solar cells using as an active layer a blend of an n-type material, such as a soluble $C_{60}$ derivatives, and a p-type material, such as a precursor polymer containing structural units of formula (II). The active layer made from the n-type/p-type material blend may become an active layer only after the conversion reaction of the thin film by heat treatment.

The invention further relates to a method of manufacturing organic transistors using a polymer containing structural units of formula (II). The active layer made from the soluble precursor polymer may become effectively active after conversion reaction towards the soluble or insoluble conjugated polymer by elimination reaction of the leaving groups and formation of the vinylene double bonds by heat treatment.

In a fourth aspect, a method for manufacturing an electronic device is disclosed. The electronic device comprises a polymer layer. In the method according to an embodiment, a layer comprising the soluble precursor polymer (II) is deposited. In a next step, the conjugated polymer (III) layer is obtained by carrying out the conversion reaction of the coated soluble precursor polymer layer towards the active soluble or insoluble conjugated polymer by elimination of the leaving groups and formation of the vinylene doubled bonds induced by heat treatment.

On the active soluble or insoluble conjugated polymer layer a further annealing treatment may be carried out in order to remove stresses of the polymer chains introduced during the deposition of the thin film layer and in order to induce a relaxation of the polymer chains and changes in the polymer film morphology. This annealing may be carried out before or after the electrode deposition on top of the active conjugated polymer layer.

These and other characteristics, features and advantages of the present invention will become apparent from the following detailed description.

Definitions

As used herein with respect to a substituting radical, and unless otherwise stated, the terms "$C_{1-7}$ alkyl" or "aliphatic saturated hydrocarbon radicals with 1 to 7 carbon atoms" means straight and branched chain saturated acyclic hydrocarbon monovalent radicals having from 1 to 7 carbon atoms such as, for example, methyl, ethyl, propyl, n-butyl, 1-methylethyl (isopropyl), 2-methylpropyl(isobutyl), 1,1-dimethylethyl(ter-butyl), 2-methyl-butyl, n-pentyl, dimethylpropyl, n-hexyl, 2-methylpentyl, 3-methylpentyl, n-heptyl and the like; the term "$C_{1-4}$ alkyl" designate the corresponding radicals with only 1 to 4 carbon atoms, and so on.

As used herein with respect to a substituting radical, and unless otherwise stated, the term "$C_{1-7}$ alkylene" means the divalent hydrocarbon radical corresponding to the above defined $C_{1-7}$ alkyl, such as methylene, bis(methylene), tris (methylene), tetramethylene, hexamethylene and the like.

As used herein with respect to a substituting radical, and unless otherwise stated, the terms "$C_{3-10}$ cycloalkyl" and "cycloaliphatic saturated hydrocarbon radical with 3 to 10 carbon atoms" mean a mono- or polycyclic saturated hydrocarbon monovalent radical having from 3 to 10 carbon atoms, such as for instance cyclopropyl, cyclobutyl, cyclopentyl, cyclohexyl, cycloheptyl, cyclooctyl and the like, or a $C_{7-10}$ polycyclic saturated hydrocarbon monovalent radical having from 7 to 10 carbon atoms such as, for instance, norbornyl, fenchyl, trimethyltricycloheptyl or adamantyl.

As used herein with respect to a substituting radical, and unless otherwise stated, the terms "aryl" and "aromatic substituent" are interchangeable and designate any mono- or polycyclic aromatic monovalent hydrocarbon radical having from 6 up to 30 carbon atoms such as but not limited to phenyl, naphthyl, anthracenyl, phenantracyl, fluoranthenyl, chrysenyl, pyrenyl, biphenylyl, terphenyl, picenyl, indenyl, biphenyl, indacenyl, benzocyclobutenyl, benzocyclooctenyl and the like, including fused benzo-$C_{4-8}$ cycloalkyl radicals (the latter being as defined above) such as, for instance, indanyl, tetrahydronaphtyl, fluorenyl and the like, all of the said radicals being optionally substituted with one or more substituents selected from the group consisting of halogen, amino, nitro, hydroxyl, sulfhydryl and nitro, such as for instance 4-fluorophenyl, 4-chlorophenyl, 3,4-dichlorophenyl, 4-cyanophenyl.

As used herein with respect to a substituting radical (including the combination of two substituting radicals), and unless otherwise stated, the term "heterocyclic" means a mono- or polycyclic, saturated or mono-unsaturated or polyunsaturated monovalent hydrocarbon radical having from 2 up to 15 carbon atoms and including one or more heteroatoms in one or more heterocyclic rings, each of said rings having from 3 to 10 atoms (and optionally further including one or more heteroatoms attached to one or more carbon atoms of said ring, for instance in the form of a carbonyl or thiocarbonyl or selenocarbonyl group, and/or to one or more heteroatoms of said ring, for instance in the form of a sulfone, sulfoxide, N-oxide, phosphate, phosphonate or selenium oxide group), each of said heteroatoms being independently selected from the group consisting of nitrogen, oxygen, sulfur, selenium and phosphorus, also including radicals wherein a heterocyclic ring is fused to one or more aromatic hydrocarbon rings for instance in the form of benzo-fused, dibenzo-fused and naphto-fused heterocyclic radicals; within this definition are included heterocyclic radicals such as, but not limited to, diazepinyl, oxadiazinyl, thiadiazinyl, dithiazinyl, triazolonyl, diazepinonyl, triazepinyl, triazepinonyl, tetrazepinonyl, benzoquinolinyl, benzothiazinyl, benzothiazinonyl, benzoxathiinyl, benzodioxinyl, benzodithiinyl, benzoxazepinyl, benzo-thiazepinyl, benzodiazepinyl, benzodioxepinyl, benzodithiepinyl, benzoxazocinyl, benzothiazocinyl, benzodiazocinyl, benzoxathiocinyl, benzo-dioxocinyl, benzotrioxepinyl, benzoxathiazepinyl, benzoxadiazepinyl, benzothiadiazepinyl, benzotriazepinyl, benzoxathiepinyl, benzotriazinonyl, benzoxazolinonyl, azetidinonyl, azaspiroundecyl, dithiaspirodecyl, selenazinyl, selenazolyl, selenophenyl, hypoxanthinyl, azahypoxanthinyl, bipyrazinyl, bipyridinyl, oxazolidinyl, diselenopyrimidinyl, benzodioxocinyl, benzopyrenyl, benzopyranonyl, benzophenazinyl, benzoquinolizinyl, dibenzocarbazolyl, dibenzoacridinyl, dibenzophenazinyl, dibenzothiepinyl, dibenzooxepinyl, dibenzopyranonyl, dibenzoquinoxalinyl, dibenzothiazepinyl, dibenzoisoquinolinyl, tetraazaadamantyl, thiatetraazaadamantyl, oxauracil, oxazinyl, dibenzothiophenyl, dibenzofuranyl, oxazolinyl, oxazolonyl, azaindolyl, azolonyl, thiazolinyl, thiazolonyl, thiazolidinyl, thiazanyl, pyrimidonyl, thiopyrimidonyl, thiamorpholinyl, azlactonyl, naphtindazolyl, naphtindolyl, naphtothiazolyl, naphtothioxolyl, naphtoxindolyl, naphtotriazolyl, naphtopyranyl, oxabicycloheptyl, azabenzimidazolyl, azacycloheptyl, azacyclooctyl, azacyclononyl, azabicyclononyl, tetrahydrofuryl, tetrahydropyranyl, tetrahydropyronyl, tetrahydroquinoleinyl, tetrahydrothienyl and dioxide thereof, dihydrothienyl dioxide, dioxindolyl, dioxinyl, dioxenyl, dioxazinyl, thioxanyl, thioxolyl, thiourazolyi, thiotriazolyl, thiopyranyl, thiopyronyl, coumarinyl, quinoleinyl, oxyquinoleinyl, quinuclidinyl, xanthinyl, dihydropyranyl, benzodihydrofuryl, benzothiopyronyl, benzothiopyranyl, benzoxazinyl, benzoxazolyl, benzodioxolyl, benzodioxanyl, benzothiadiazolyl, benzotriazinyl, benzothiazolyl, benzoxazolyl, phenothioxinyl, phenothiazolyl, phenothienyl (benzothiofuranyl), phenopyronyl, phenoxazolyl, pyridinyl, dihydropyridinyl, tetrahydropyridinyl, piperidinyl, morpholinyl, thiomorpholinyl, pyrazinyl, pyrimidinyl, pyridazinyl, triazinyl, tetrazinyl, triazolyl, benzotriazolyl, tetrazolyl, imidazolyl, pyrazolyl, thiazolyl, thiadiazolyl, isothiazolyl, oxazolyl, oxadiazolyl, pyrrolyl, furyl, dihydrofuryl, furoyl, hydantoinyl, dioxolanyl, dioxolyl, dithianyl, dithienyl, dithiinyl, thienyl, indolyl, indazolyl, benzofuryl, quinolyl, quinazolinyl, quinoxalinyl, carbazolyl, phenoxazinyl, phenothiazinyl, xanthenyl, purinyl, benzothienyl, naphtothienyl, thianthrenyl, pyranyl, pyronyl, benzopyronyl, isobenzofuranyl, chromenyl, phenoxathiinyl, indolizinyl, quinolizinyl, isoquinolyl, phthalazinyl, naphthiridinyl, cinnolinyl, pteridinyl, carbolinyl, acridinyl, perimidinyl, phenanthrolinyl, phenazinyl, phenothiazinyl, imidazolinyl, imidazolidinyl, benzimidazolyl, pyrazolinyl, pyrazolidinyl, pyrrolinyl, pyrrolidinyl, piperazinyl, uridinyl, thymidinyl, cytidinyl, azirinyl, aziridinyl, diazirinyl, diaziridinyl, oxiranyl, oxaziridinyl, dioxiranyl, thiiranyl, azetyl, dihydroazetyl, azetidinyl, oxetyl, oxetanyl, thietyl, thietanyl, diazabicyclooctyl, diazetyl, diaziridinonyl, diaziridinethionyl, chromanyl, chromanonyl, thiochromanyl, thiochromanonyl, thiochromenyl, benzofuranyl, benzisothiazolyl, benzocarbazolyl, benzochromonyl, benzisoalloxazinyl, benzocoumarinyl, thiocoumarinyl, phenometoxazinyl, phenoparoxazinyl, phentriazinyl, thiodiazinyl, thiodiazolyl, indoxyl, thioindoxyl, benzodiazinyl (e.g. phtalazinyl), phtalidyl, phtalimidinyl, phtalazonyl, alloxazinyl, dibenzopyronyl (i.e. xanthonyl), xanthionyl, isatyl, isopyrazolyl, isopyrazolonyl, urazolyl, urazinyl, uretinyl, uretidinyl, succinyl, succinimido, benzylsultimyl, benzylsultamiyl and the like, including all possible isomeric forms thereof, wherein each carbon atom of said heterocyclic ring may be independently substituted with a substituent selected from the group consisting of halogen, nitro, $C_{1-7}$ alkyl (optionally containing one or more functions or radicals selected from the group consisting of carbonyl (oxo), alcohol (hydroxyl), ether (alkoxy), acetal, amino, imino, oximino, alkyloximino, amino-acid, cyano, carboxylic acid ester or amide, nitro, thio $C_{1-7}$ alkyl, thio $C_{3-10}$ cycloalkyl, $C_{1-7}$ alkylamino, cycloalkylamino, alkenylamino, cycloalkenylamino, alkynylamino, arylamino, arylalkylamino, hydroxyalkylamino, mercaptoalkylamino, heterocyclic amino, hydrazino, alkylhydrazino, phenylhydrazino, sulfonyl, sulfonamido and halogen), $C_{2-7}$ alkenyl, $C_{2-7}$ alkynyl, halo $C_{1-7}$ alkyl, $C_{3-10}$ cycloalkyl, aryl, arylalkyl, alkylaryl, alkylacyl, arylacyl, hydroxyl, amino, $C_{1-7}$ alkylamino, cycloalkylamino, alkenylamino, cyclo-alkenylamino, alkynylamino, arylamino, arylalkylamino, hydroxyalkylamino, mercaptoalkylamino, heterocyclic amino, hydrazino, alkylhydrazino, phenylhydrazino, sulfhydryl, $C_{1-7}$ alkoxy, $C_{3-10}$ cycloalkoxy, aryloxy, arylalkyloxy, oxyheterocyclic, heterocyclic-substituted alkyloxy, thio $C_{1-7}$ alkyl, thio $C_{3-10}$ cycloalkyl, thioaryl, thioheterocyclic, arylalkylthio, heterocyclic-substituted alkylthio, formyl, hydroxylamino, cyano, carboxylic acid or esters or thioesters or amides thereof, thiocarboxylic acid or esters or thioesters or amides thereof; depending upon the number of unsaturations in the 3 to 10 membered ring, heterocyclic radicals may be sub-divided into heteroaromatic (or "heteroaryl") radicals and non-aromatic heterocyclic radicals; when a heteroatom of the said non-aromatic heterocyclic radical is nitrogen, the latter may be substituted with a substituent selected from the group consisting of $C_{1-7}$ alkyl, $C_{3-10}$ cycloalkyl, aryl, arylalkyl and alkylaryl.

As used herein with respect to a substituting radical, and unless otherwise stated, the terms "$C_{1-7}$ alkoxy", "$C_{3-10}$ cycloalkoxy", "aryloxy", "arylalkyloxy", "oxyheterocyclic", "thio $C_{1-7}$ alkyl", "thio $C_{3-10}$ cycloalkyl", "arylthio", "arylalkylthio" and "thioheterocyclic" refer to substituents wherein a $C_{1-7}$ alkyl radical, respectively a $C_{3-10}$ cycloalkyl, aryl, arylalkyl or heterocyclic radical (each of them such as defined herein), are attached to an oxygen atom or a divalent sulfur atom through a single bond, such as but not limited to methoxy, ethoxy, propoxy, butoxy, pentoxy, isopropoxy, sec-butoxy, tert-butoxy, isopentoxy, cyclopropyloxy, cyclobutyloxy, cyclopentyloxy, thiomethyl, thioethyl, thiopropyl, thiobutyl, thiopentyl, thiocyclopropyl, thiocyclobutyl, thiocyclopentyl, thiophenyl, phenyloxy, benzyloxy, mercaptobenzyl, cresoxy, and the like.

As used herein with respect to a substituting atom, and unless otherwise stated, the term halogen means any atom selected from the group consisting of fluorine, chlorine, bromine and iodine.

As used herein with respect to a substituting radical, and unless otherwise stated, the terms "arylalkyl", "arylalkenyl" and "heterocyclic-substituted alkyl" refer to an aliphatic saturated or unsaturated hydrocarbon monovalent radical (preferably a $C_{1-7}$ alkyl or $C_{2-7}$ alkenyl radical such as defined above) onto which an aryl or heterocyclic radical (such as defined above) is already bonded, and wherein the said aliphatic radical and/or the said aryl or heterocyclic radical may be optionally substituted with one or more substituents selected from the group consisting of halogen, amino, nitro, hydroxyl, sulfhydryl and nitro, such as but not limited to benzyl, 4-chlorobenzyl, phenylethyl, 1-amino-2-phenylethyl, 1-amino-2-[4-hydroxyphenyl]ethyl, 1-amino-2-[indol-2-yl]ethyl, styryl, pyridylmethyl, pyridylethyl, 2-(2-pyridyl)isopropyl, oxazolylbutyl, 2-thienylmethyl and 2-furylmethyl.

DESCRIPTION OF ILLUSTRATIVE EMBODIMENT

The present invention will be described with respect to particular embodiments but the invention is not limited thereto but only by the claims.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

The compounds referred to in the detailed description may be selected from the compounds described in the following list:

Compound (I) having the general formula:

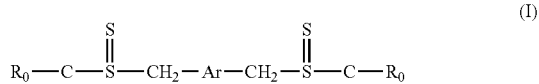

wherein Ar may be an aromatic or heteroaromatic divalent group. In a preferred embodiment, Ar may comprise 4 to 20 carbon atoms. In another embodiment, each of the Ar groups may be substituted with one or more substituents independently selected from the group consisting of $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl group or a benzyl group. These Ar groups may comprise up to 4 heteroatoms chosen from the group comprising oxygen, sulphur, and nitrogen in the aromatic cyclic system. The substituents on Ar groups may be independently linear, or cyclic, or two of these substituents may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-diyl; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene or 2,5-thienylene and most preferably Ar may be 2,5-thienylene.

$R_0$ may be an aromatic divalent group or a heteroaromatic divalent group consisting of an amine —$NR_1R_2$, a $C_5$-$C_{20}$ alkyloxy group, an aryloxy group, an alkyl-group, an aryl group, an alkylaryl group, an arylalkyl group, a thioether group, an ester group, an acid carboxylic group. In a preferred embodiment, $R_0$ may be an amine —$NR_1R_2$, in which $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, $R_1$ and $R_2$ may be linked together to form a cycle. Preferably, $R_1$ and $R_2$ may be independently selected from a methyl group, an ethyl group, a propyl group, a phenyl group and a benzyl group. The alkyl group, phenyl group and benzyl group may comprise heteroatoms and substituents.

Compound (II) having the general formula:

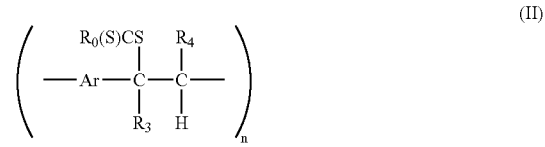

wherein Ar may be an aromatic or heteroaromatic divalent group. In a preferred embodiment, Ar may comprise 4 to 20 carbon atoms. In another embodiment, each of the recited Ar groups may be substituted with one or more independently selected substituents chosen from the group consisting of a $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG),a phenyl or a benzyl group and these Ar groups may comprise up to 4 heteroatoms chosen from the group comprising oxygen, sulphur, and nitrogen in the aromatic cyclic system. The substituents on the Ar groups may be independently linear, or cyclic, or two of these groups may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7- diyl. Preferably, Ar may be 1,4-phenylene or 2,5-thienylene and most preferably Ar may be 2,5-thienylene.

$R_0$ may be an aromatic divalent group or a heteroaromatic divalent group consisting of an amine —$NR_1R_2$, a $C_5$-$C_{20}$ alkyloxy group, an aryloxy group, an alkyl group, an aryl group, an alkylaryl group, an arylalkyl group, a thioether group, an ester group, an acid carboxylic group.

In a preferred embodiment, $R_0$ may be an amine —$NR_1R_2$,

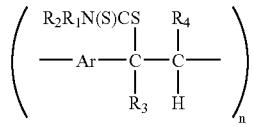

in which $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, $R_1$ and $R_2$ may be linked together to form a cycle. Preferably, $R_1$ and $R_2$

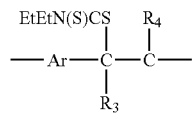

may be independently selected from a methyl group, an ethyl group, a propyl group, a phenyl group and a benzyl group. The alkyl group, phenyl group and benzyl group may comprise heteroatoms and substituents. One typical example of such a precursor polymer may be a precursor polymer wherein $R_0$ =—$NR_1R_2$ and wherein $R_1$=$R_2$=Et In other specific examples of precursor polymers which may be used according to embodiments, $R_0$ may be a phenyl group (Ph), a methyl group ($CH_3$) or a group ($F_6C_6O$):

In other specific examples, precursor polymers may be based on poly(p-phenylene

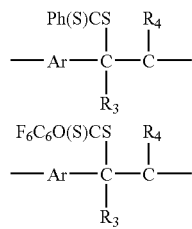

vinylene) derivatives, such as for example alkoxy poly(p-phenlyne vinylene) (alkoxy-PPV) derivatives such as e.g. poly(2-methoxy,5-3',7'-dimethyloctyloxy)-1,4-phenylene vinylene (MDMO-PPV or $OC_1C_{10}$PPV), or on poly(p-thienylene vinylene) (PTV) derivative, and $R_3$ and $R_4$ may be chosen from the group comprising a hydrogen atom, a $C_1$-$C_{20}$-alkyl group, a cyclic $C_4$-$C_{20}$-alkyl group, a phenyl group and a benzyl group, which groups may comprise heteroatoms and substituents. In a preferred embodiment, $R_3$ and $R_4$ may be hydrogen.

Compound (III) having the general formula:

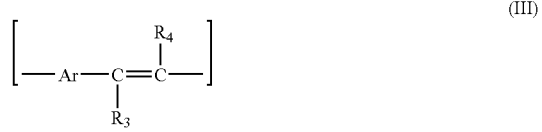

wherein Ar may be an aromatic or heteroaromatic, divalent group. In a preferred embodiment, Ar comprises 4 to 20 carbon atoms. In another embodiment, each of the Ar groups may be substituted with one or more independently selected substituents chosen from the group consisting of a $C_1$-$C_{20}$-alkyl, $C_3$-$C_{20}$-alkoxy, $C_1$-$C_{20}$-alkylsulfate, oligo or poly (ethylene oxide) (PEO), oligo or poly(ethylene glycol) (PEG), a phenyl or a benzyl group and these Ar groups may comprise up to 4 heteroatoms chosen from the group comprising oxygen, sulphur, and nitrogen in the aromatic divalent group. The substituents on Ar groups may be independently linear, or cyclic, or two of these substituents may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-diyl; 1,3, 4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene or 2,5-thienylene and most preferably Ar may be 2,5-thienylene.

$R_3$ and $R_4$ may be chosen from the group comprising a hydrogen atom and a $C_1$-$C_{20}$-alkyl group, a cyclic $C_4$-$C_{20}$-alkyl group, a phenyl group and a benzyl group, which groups may comprise heteroatoms and substituents. In a preferred embodiment, $R_3$ and $R_4$ may be hydrogen.

Compound (IV) having the general formula:

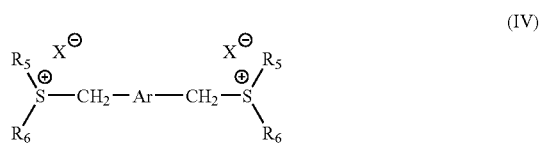

wherein Ar may be an aromatic or heteroaromatic divalent group. In a preferred embodiment, Ar may comprise 4 to 20 carbon atoms. In another embodiment, each of the Ar groups may be substituted with one or more substituents independently chosen from the group consisting of a $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl or a benzyl group and these Ar groups may comprise up to 4 heteroatoms chosen from the group comprising oxygen, sulphur, and nitrogen in the aromatic cyclic system. The substituents on the Ar groups may be independently linear, or cyclic, or two of these substituents may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl;

1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene or 2,5-thienylene and most preferably Ar may be 2,5-thienylene.

X may be selected from the group consisiting of Cl, Br or F.

$R_5$ and $R_6$ may be selected from the group consisting of a $C_1$-$C_{20}$-alkyl group, a cyclic $C_4$-$C_{20}$-alkyl group, a phenyl group and a benzyl group, which groups may comprise heteroatoms and substituents.

Compound (V) having the general formula

Y—Ar—Y     (V)

wherein Y may comprise chloromethyl, bromomethyl or fluoromethyl atoms and wherein Ar may be an aromatic or heteroaromatic divalent group. In a preferred embodiment, Ar may comprise 4 to 20 carbon atoms. In another embodiment, each of the Ar groups may be substituted with one or more substituents independently chosen from the group consisting of a $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl or a benzyl group and these Ar groups may comprise up to 4 heteroatoms chosen from the group comprising oxygen, sulphur, and nitrogen in the aromatic cyclic system. The substituents on the Ar groups may be independently linear, or cyclic, or two of these substituents may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene or 2,5-thienylene and most preferably Ar may be 2,5-thienylene.

Compound (VI) having the general formula:

(VI)

wherein Z may be a leaving group. In a preferred embodiment, Z may be selected from the group consisting of Cl, Br, I, —O-Tos, —O-Mes, —O-Triflates, —$(NR_1R_1R_1)^+$, —$(SR_1R_2)^+$, —$OOCR_1$ and —$SC(S)OR_1$. In the above formula, the Y may be a polarizer group and may be selected form the group consisting of —$SR_1$, —$OR_1$, —OH, —Cl, —Br, —SO—$R_1$, —CN, —CO—$OR_1$ and —S—$C(S)OR_1$, $R_7$ and $R_8$ may independently be —H, $R_1$, and Ar may be an aromatic or heteroaromatic divalent group. In a preferred embodiment, Ar may comprise 4 to 20 carbon atoms. In another embodiment, each of the Ar groups may be substituted with one or more substituents independently chosen from the group consisting of a $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl or a benzyl group and these Ar groups may comprise up to 4 heteroatoms chosen from the group comprising oxygen, sulphur, and nitrogen in the aromatic divalent group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,1 0-anthracenediyl; 2,5-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-bi-phenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene or 2,5-thienylene and most preferably Ar may be 2,5-thienylene.

$R_1$, $R_2$, $R_3$ may be equal to $R_1$, $R_2$, $R_3$ as defined for compound (II).

In a first aspect, the synthesis of a soluble precursor polymer (II) starting from the monomer (I) is provided. An embodiment also provides the synthesis of monomer (I). The second aspect comprises the conversion reaction of the soluble precursor polymer to the related conjugated polymer which may be soluble or insoluble depending on the chemical structure. The method does not require the use of chain end controlling agents during the polymerisation reaction as the obtained precursor polymers are always soluble whatever the Ar groups are.

Furthermore, an embodiment comprises the manufacturing of an active layer from the precursor polymer. The last step is the electronic device made from the precursor polymer followed by its conversion reaction towards the conjugated polymer as pristine material or in blend.

The first aspect thus provides the synthesis of a soluble precursor polymer (II). Therefore, first a monomer has to be provided. Therefore, as an example and not limiting to the invention, a dithiocarbamic acid sodium salt is added in the solid state to an aromatic or heteroaromatic ring structure of the general formula of compound (IV) or to an aromatic or heteroaromatic ring structure with general formula of compound (V) in a mixture of organic solvents. After stirring a few hours at room temperature, the reaction product may be extracted with for example ether and dried over magnesium sulphate. The product of that reaction is an arylene or heteroarylene group bearing two dithiocarbamate groups in para positions as described in formula (I).

Mono- and bis-dithiocarbamate molecules may in this invention be used as photoiniferters. An example of such a bifunctional iniferter is p-xylylene bis(N,N-diethyl dithiocarbamate). It was first synthesised in 1984 by Otsu et al (T. Otsu, A. Kuriyama, Polym. Bull. 1984, 11, 2, 135), and was used for the living radical polymerization of styrene and methyl methacrylate. Otsu wrote an extensive review on the iniferter concept and living radical polymerization (T. Otsu, J. Polym. Sci., Part A: Polym. Chem. 2000, 38, 12, 2121). The use of p-xylylene bis(N,N-diethyl dithiocarbamate) as a monomer in a polymerization process was not found.

The synthesis of thiophene-2,5-diylbismethylene N,N-diethyl thiocarbamate was patented by Nishiyama et al. in 1975 for its herbicidal activities (Jpn. Tokkyo Koho, No 50004732, 1975), but again no report exists on the use of the dithiocarbamate "thiophene" analogue as a monomer for polymerization to soluble precursor polymers which may be converted by thermal elimination (leaving groups eliminated) towards the conjugated semiconductors, which may be soluble or insoluble, depending on their chemical structure.

According to the first aspect the monomer having the general formula (I) is reacted with a basic compound in the presence of an organic solvent to obtain the soluble precursor polymer (II). It has to be noted that no chain end controlling agents are required to obtain this soluble precursor polymer (II).

A mixture of different starting monomers of formula (I) may be reacted by using the above method, leading to copolymers. Alternatively, a mixture of different starting monomers of formula (I) and of formula (VI) may be polymerised by using this method leading to copolymers. Those copolymers may then be used as polyiniferters in iniferter controlled free-radical polymerization to the synthesis of block copolymers and grafted polymers.

The precursor polymers in accordance with the formula (II), that may be prepared by an embodiment, preferably may comprise as the Ar group an aromatic or heteroaromatic group chosen from 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-bi-phenylene; phenantrene-2,7-diyl; 9,10-dihydrophenantrene-2,7-diyl; dibenzofurane-2,7-diyl; dibenzothiophene-2,7-diyl; carbazole-2,7-diyl, of which the nitrogen-containing groups may be substituted on the nitrogen atom with a $C_1$-$C_{22}$-alkyl or a $C_2$-$C_{10}$-aryl group, while in all groups the R atoms on the aromatic rings may be substituted by a $C_1$-$C_{22}$ linear, cyclic or branched alkyl group, $C_4$-$C_{14}$ aryl group, electron-donating groups such as $C_1$-$C_{22}$ alkoxy and alkylthio groups, and halogen atoms or electron-attracting groups such as cyano, nitro, and ester groups, while the $C_1$-$C_{14}$ aryl group itself may be substituted by electron-donating or electron-attracting groups.

The basic compound may be a metal base, an ammonium base or a non-charged base such as amines like for example triethylamine, pyridine and non-ionic phosphazene bases. The metal in these basic compounds may preferably be an alkali metal or an alkali earth metal, i.e. a metal from group I or II. Classes of metal and ammonium bases are metal hydrides, such as NaH or KH, metal hydroxides, such as NaOH, LiOH or kOH, metal alkoxides, such as NaOMe or NaOEt; KotBu; metal amines such as a lithium-ammonia solution, a sodium-ammonia solution, lithium in methylamine; metal amides, such as $NaNH_2$, $NaN(SiMe_3)_2$, lithiumdiisopropylamide (LDA), organometal compounds wherein the metal is an alkali metal or alkali earth metal, such as for example a $C_{1-20}$ alkyl lithium (e.g. n-BuLi) or a $C_{1-20}$ alkyl sodium, Grignard reagents, and ammonium hydroxides. Grignard reagents are organic magnesium halides preferably dissolved in a non-reactive solvent (typically dry ethyl ether). The substance is made up of an organic group, e.g. an alkyl or aryl group, joined by a highly polar covalent bond to magnesium, while the magnesium is joined by an ionic bond to a halogen ion e.g. bromide or iodide.

The amount of basic compound may vary from 1 to 2 equivalents with respect to the starting monomer. It may be preferred to use one equivalent of basic compound because a too high concentration of basic compound may induce an in situ conversion reaction during the polymerization.

In polar aprotic solvents it is preferred to use metal hydrides as they show substantially no nucleophilic properties. In polar protic solvents it is preferred to use bases with a pKa larger than the pKa of the solvent. In this case the solvent is deprotonated and acts as the actual basic compound. In the method of an embodiment, it may be preferred to use an aprotic solvent. A mixture of solvents may also be used. Examples of solvents which may be used are for example amides of the general formula $R_5$—$CONR_6H$, amines of the general formula $R_7R_7$—N—$R_8$, sulfones of the general formula $R_8$—$SO_2$—$R_9$, sulfoxides of the general formula $R_8$—SO—$R_9$, a solvent from the group consisting of alcohols, such as for example sec-butanol and all linear or branched $C_nH_{2n+2}O$ where $1 \leq n \leq 20$, glycols, polyethers, cyclic ethers, unsaturated ethers, wherein $R_5$, $R_6$ are the same or different and denote H, a linear or branched alkyl group, or $R_5$ and $R_6$ together are —$(CH_2)_2$—, —$(CH_2)_3$—, $CH_2$—CH=$CH_2$—$CH_2$ or —$(CH_2)_4$—; and $R_7$ has the meaning of $R_5$ or is a phenyl group which is unsubstituted or substituted by halogen, methyl and/or methoxy groups; and $R_8$, $R_9$ are the same or different and have the meaning of $R_7$, except H, or $R_8$ and $R_9$ together are —$(CH_2)_2$—, —$(CH_2)_3$—, —$(CH_2)_4$— or —$CH_2$—CH=CH—$CH_2$—.

The concentration of starting monomer (I) may be determined by the solubility of the monomer (I). All concentration of the starting monomer (I) in a solvent may be used as long as the monomer (I) is still fully soluble. However, a concentration of between 0.1 M and 0.3 M may generally be preferred.

In a preferred embodiment, a solution of the monomer of formula (I) or a mixture of at least two monomers of formula (I) at a giving temperature may be degassed for a giving time by passing through a continuous nitrogen flow. A basic compound dissolved in an organic solvent may then be added in one-go to the stirred monomer solution. The polymer may then be precipitated in ice-cold water and extracted, washed and dried. The precursor polymer with structural units of formula (II) such obtained is fully soluble in common organic solvents such as for example THF, cyclohexanone, DMF, chloroform, DMSO, toluene, benzene, dichlorobenzene, dichloromethane, acetone, dioxane and shows an average molecular weight (Mw) between 5.000 and 1.000.000 and a polydispersity between 2 and 15 measured by gel permeation chromatography relative to polystyrene standards.

In a second aspect, the precursor polymer (II) formed in the first aspect, is converted into the corresponding soluble or insoluble conjugated polymer having the general formula (III).

The soluble precursor polymer may be converted into the corresponding conjugated polymer with units of structural formula (III) in two ways:

1. by elimination of the leaving groups and formation of the vinylene double bonds by thermal heating of the precursor polymer solution under inert atmosphere or
2. by elimination of the leaving groups and formation of the vinylene double bonds by thermal heating in thin film. The thin films are prepared from the soluble precursor polymer by, for example, spin-coating, drop-casting, ink-jet printing or doctor-blading or any other film-making techniques, and converted by heating under vacuum or under inert atmosphere. The conversion in thin film is preferred when the conjugated polymer is expected to be insoluble, therefore the conversion of the soluble precursor polymer towards the conjugated polymer is made in situ in thin film.

In one embodiment, the polymer (III) may be formed by performing the conversion step of the soluble precursor polymer towards the soluble conjugated polymer in solution. The conversion in solution is preferably when the conjugated polymer is a soluble polymer. The precursor polymer (II) may be subjected to a thermal conversion step at a temperature between 30° C. and 300° C. The conversion reaction of the precursor polymer (II) starts around 100° C. and is completed at around 250-300° C. depending on the chemical structure of the polymer. In this embodiment, the precursor polymer (II) may thus be dissolved in a solvent in a giving concentration, typically 0.1 M, and is degassed by passing through a continuous nitrogen flow for, for example, 1 hour. The temperature may then be increased and the inert atmosphere is maintained during the conversion reaction and the cooling down. A typical procedure comprises heating a ramp from room temperature to the conversion temperature at 2° C./min, followed by isotherm at the conversion temperature for 3 hours and cooling down to room temperature. In another embodiment, more than one cycle as described above may be applied to the polymer.

In still another embodiment, the soluble or insoluble conjugated polymer (III) may be formed by performing the conversion step in thin film. Herefore, glass substrates coated with indium tin oxide (ITO) are cleaned with isopropanol in an ultrasonic bath for 20 minutes and dried in nitrogen flow. The precursor polymer (II) may then be coated on the glass substrate from solution. A two-step process may be used. A first step determines the film thickness and may be done with a closed cover for, for example, 5 seconds at 600 rpm. In a second step the film may be dried with an open cover for, for example, 2 minutes at 40 rpm.

The conversion of the precursor polymer (II) towards the soluble or insoluble conjugated polymer in thin film may be done in a glove box under inert atmosphere on a hot plate from room temperature to the conversion temperature at 2° C./min followed by 10 minutes at the conversion temperature. The conversion reaction may be carried out also under vacuum conditions.

The polymer (III) is preferably kept under inert atmosphere.

In a further embodiment, an annealing treatment of the soluble or insoluble conjugated polymer in thin film may be carried out at a temperature of between 30° C. and 200° C. during 1 minute to 2 hours under vacuum or inert atmosphere in order to remove stresses of the polymer chains introduced during the deposition of the thin film layer and in order to induce a relaxation of the conjugated polymer chains and to change the conjugated polymer film morphology. No changes occur in the chemical structure of the conjugated polymer during this annealing treatment (heat treatment on conjugated polymer), in contrary to the conversion reaction (heat treatment on precursor polymer) which involves, under heating, an elimination of the leaving groups of the soluble precursor polymer with the formation of vinylene double bonds. This annealing treatment may be carried out before or after the electrode deposition on top of the active conjugated polymer layer.

According to the previous embodiment, the conversion of the precursor polymer (II) may be performed until substantially all leaving groups are eliminated. However, a conjugated polymer may not be fully, i.e. 100%, conjugated because there can always be structural defects which can lead to about 2 to 8%, in most cases between 2 to 5%, of the resulting polymer that has not been conjugated. Therefore, a reference herein to a conjugated polymer may include within its scope a deviation from complete conjugation of about 2 to 5%.

In still another embodiment, the conversion of the precursor polymer may be performed only partially. Hence, in the resulting partially converted conjugated polymer, there may still be leaving groups present. The percentage of remaining leaving groups within the resulting conjugated polymer may be tuned by changing the experimental conditions such as, for example, temperature, conversion time, atmosphere. The amount of remaining leaving groups may be between 0 and 10%. For example, if the percentage of the remaining leaving groups is 5%, it means that there are, in the: resulting partially converted conjugated polymer, for 100 monomer units 5 monomer units still having a leaving group and 95 monomer units not having a leaving group.

In a specific, preferred embodiment, the conjugated arylene or heteroarylene, vinylene polymer is a poly(2,5-thienylene vinylene) or PTV polymer with formula:

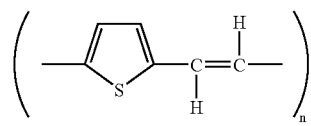

Due to the fact that the polymer is prepared by a method as described herein, the poly(2,5-thienylene vinylene) polymer according to an embodiment shows a peak at a wavelength higher than 520 nm in the absorption spectrum.

In another embodiment, also other PTV derivatives, which have side chains on the 2 and 3 positions (instead of on the 2 and 5 positions in the previous embodiment) on the thiophene ring may be used.

In a third aspect, an electronic device comprising a polymer according to formula (III) is disclosed. The electronic devices may be, but are not limited hereto, for example organic field effect transistors, bilayer heterojunction organic solar cells and bulk heterojunction organic solar cells. During the processing of the electronic devices, the precursor polymer (II) may be deposited and subsequently subjected to a thermal conversion step (according to the second aspect) such that an active layer may be formed.

According to the third aspect, an organic bulk heterojunction solar cell with acceptable efficiency may be prepared from the precursor polymer (II). This may be advantageous over prior art methods, where the conjugated polymer is the starting compound and hence must be soluble to be mixed with a soluble $C_{60}$ derivative (for example PCBM). As the conversion temperature of the precursor polymer of formula (II) starts relatively at low temperature (e.g. 100-115° C.), it may be possible to prepare a blend n-type/p-type, used as active layer, by mixing the precursor polymer (II) with PCBM and then carrying out the conversion reaction by heat treatment in thin film keeping the initial chemical structure of PCBM and converting simultaneously the soluble precursor polymer to the soluble or insoluble conjugated polymer. Furthermore, any other p-type material being a small molecule or an oligomer or a polymer other than $C_{60}$ or PCBM and having a chemical structure stable at the temperature used during the conversion reaction of the precursor polymer towards the conjugated polymer may be also considered.

For the bulk heterojunction solar cells in accordance to the third aspect the precursor polymer may contain the structural units of formula (II) wherein $R_1$, $R_2$ may be as described in formula (II) and wherein Ar may be 2,5-thienylene, which may be substituted on its 3 and 4 positions by a $C_1$-$C_{22}$ linear or branched alkyl group, $C_4$-$C_{14}$ aryl group, electron-donating groups such as $C_1$-$C_{22}$ linear or branched alkoxy and alkylthio groups, and halogen atoms or electron-attracting groups such as cyano, nitro, and ester groups, while the $C_1$-$C_{14}$ aryl group itself may be substituted by electron-donating or electron-attracting groups, and the two substituent groups on the Ar group may be linked together to form a cycle on the Ar group, and a soluble $C_{60}$ derivative may be used as n-type material, such as PCBM. The active layer may be obtained by carrying out the conversion reaction by heat treatment of the thin film keeping intact the initial chemical structure of the soluble $C_{60}$ derivative.

A fourth aspect comprises the manufacturing of bilayer organic solar cells, organic transistors and LED's having an active layer made from a precursor polymer containing structural units of formula (II) which is in situ converted to the active soluble or insoluble conjugated polymer.

Furthermore, bilayer organic solar cells in accordance with the fourth aspect are disclosed wherein the precursor polymer may comprise the structural units of formula (II) wherein $R_0$ may be as described in formula (II) and wherein Ar may be 2,5-thienylene, which may be substituted on its 3 and/or 4 positions by a $C_1$-$C_{22}$ linear or branched alkyl group, $C_4$-$C_{14}$ aryl group, electron-donating groups such as $C_1$-$C_{22}$ linear, cyclic or branched alkoxy and alkylthio groups, and halogen atoms or electron-attracting groups such as cyano, nitro, and ester groups, while the $C_1$-$C_{14}$ aryl group itself may be substituted by electron-donating or electron-attracting groups. At least two of these independently chosen substituents may, in one embodiment, be linked together to form a cyclic structure on the Ar group between the 3 and 4 positions. The active layer may be obtained by carrying out the conversion reaction by heat treatment of the thin film.

Furthermore, organic transistors in accordance with the fourth aspect are disclosed wherein the precursor polymer may comprise the structural units of formula (II) wherein $R_0$ may be as described in formula (II) and wherein Ar may be 2,5-thienylene which may be substituted on its 3 and 4 positions by a $C_1$-$C_{22}$ linear or branched alkyl group, $C_4$-$C_{14}$ aryl group, electron-donating groups such as $C_1$-$C_{22}$ linear or branched alkoxy and alkylthio groups, oligo- or poly(ethylene oxide) (PEO), oligo- or poly(ethylene glycol) (PEG), and halogen atoms or electron-attracting groups such as cyano, nitro, and ester groups, while the $C_1$-$C_{14}$ aryl group itself may be substituted by electron-donating or electron-attracting groups. At least two of these independently chosen substituents may, an one embodiment, be linked together to form a cyclic structure on the Ar group between the 3 and 4 positions. The active layer may be obtained by carrying out the conversion reaction of the precursor polymer towards the related soluble or insoluble conjugated polymer by heat treatment of the thin film.

Furthermore, Light emitting diodes (LED) in accordance with the fourth aspect are disclosed wherein the LED may comprise a substrate having deposited thereon successively a thin film of a soluble precursor polymer according to structural formula (II), prepared in accordance to the first aspect and converted to the conjugated polymer with structural formula (III) by heat treatment in accordance with the second aspect and a layer of an electrical conductor together with means for biasing the thin film and conductor.

EXAMPLE 1

In a first example the synthesis of p-xylylene bis(N,N-diethyl dithiocarbamate) with a formula according to formula (I) wherein Ar=1,4-phenylene, $R_0$=—$NR_1R_2$ with $R_1$=$R_2$=$C_2H_5$, followed by the polymerization to the precursor polymer with a formula according to formula (II) wherein Ar=1,4-phenylene, $R_0$=—$NR_1R_2$ with $R_1$=$R_2$=$C_2H_5$, $R_3$=$R_4$=H and subsequent conversion to the conjugated polymer with a formula according to formula (III) wherein Ar=1,4-phenylene, $R_3$=$R_4$=H is illustrated.

To 50 ml of an acetonitrile/water solution (5% vol water) of 1,4-bis(tetrahydrothiopheniomethyl)xylene dichloride (6 g, 17.143 mmol), diethyldithiocarbamic acid sodium salt trihydrate (8.87 g, 39.429 mmol) is added as a solid, after which the mixture is stirred at ambient temperature for two hours. Then, water is added and the desired monomer is extracted with ether (3×100 ml) and dried over $MgSO_4$. Evaporation of the solvent yields 6.2 g, which is 90%, of the pure product as a white solid. $^1H$ NMR ($CDCl_3$): 7.31 (s, 4H), 4.49 (s, 4H), 4.01 (q, J=7.2 Hz, 4H), 3.69 (q, J=7.2 Hz, 4H), 1.25 (2t, J=7.2 Hz, 12H). $^{13}C$ NMR ($CDCl_3$): 195.10, 135.27, 129.57, 49.46, 46.70, 41.79, 12.44, 11.56; MS (EI, m/e): 253 ($M^+$–SC(S)$NEt_2$), 148 (SC(S)$NEt_2$), 105 ($M^+$–2× SC(S)$NEt_2$), 72 ($NEt_2$)

A solution of the synthesised monomer p-xylene bis(N, N-diethyldithiocarbamate) (500 mg, 1.25 mmol) in dry THF (6.25 ml, 0.2 M) at −78° C. (or RT or 0° C.) is degassed for 1 hour by passing through a continuous nitrogen flow. An equimolar LDA solution (625 µl of a 2 M solution in THF) is added in one go to the stirred monomer solution. The THF from the basic solution is neglected in the calculation of the monomer concentration. The mixture is then kept at −78° C. (or R.T or 0° C.) for 90 minutes while the passing of nitrogen is continued. After this, the solution is allowed to come to 0° C. or ethanol (6 ml) is added at −78° C. to stop the reaction (this is not necessary if the polymerization is performed at RT or 0° C.). The polymer is then precipitated in ice water (100 ml) and extracted with chloroform (3×60 ml). The solvent of the combined organic layers is evaporated under reduced pressure and a second precipitation is performed in a 1/1 mixture. (100 ml) of diethyl ether and hexane at 0° C. The polymer was collected and dried in vacuum. $^1H$ NMR ($CDCl_3$): 6.78-7.14 (br s, 4H), 5.00-5.30 (br s, 1H), 3.82-4.10 (br s, 2H), 3.51-3.78 (br s, 2H), 2.92-3.12 (br s, 2H), 1.04-1.34 (br t, 6H). $^{13}C$ NMR ($CDCl_3$): 194.38, 138.07, 137.17, 129.35, 128.30, 56.92, 49.15, 46.68, 42.63, 12.58, 11.65. The residual fractions only contained monomer residues. Polymerization experiments are carried out at different temperatures. The results are summarised in table 1. In this table, Mw denotes the molecular weight and PD the polydispersity of the conjugated polymer.

TABLE 1

Starting monomer with structural units of formula (I) with:
Ar = 1,4-phenylene, $R_0$ = —$NR_1R_2$ with $R_1$ = $R_2$ = Et in THF.

| Conc. (M) | Polymerisation temp. (° C.) | Yield (%) | Mw (g/mol) | PD |
|---|---|---|---|---|
| 0.2 | −78 | 90 | 7300 | 1.5 |
|  | −78 to 0 | 88 | 15000 | 2.1 |
|  | 0 | 87 | 31200 | 4.1 |
|  | RT | 88 | 36500 | 5.5 |

EXAMPLE 2

In a second example, the synthesis of thiophene-2,5-diylbismethylene N,N-diethyl dithiocarbamate with a formula according to formula (I) wherein Ar = 2,5-thienylene and $R_0$=—$NR_1R_2$ with $R_1$=$R_2$=$C_2H_5$, followed by polymerization to the precursor polymer with a formula according to formula (II) wherein Ar=2,5-thienylene, R=—$NR_1R_2$ with $R_1$=$R_2$=$C_2H_5$ and $R_3$=$R_4$=H, and subsequent conversion to the conjugated polymer with a formula according to formula (III) wherein Ar=2,5-thienylene and $R_3$=$R_4$=H, is illustrated.

The preparation of the monomer is analogous to that described in example 1, but here a bis-sulphonium salt of formula (IV) where Ar=2,5-thienylene is used. The yield of the reaction is 81%; $^1$H NMR (CDCl$_3$): 6.84 (s, 2H), 4.69 (s, 4H), 4.01 (q, J=7.2 Hz, 4H), 3.69 (q, J=7.2 Hz, 4H), 1.26 (t, J=7.2 Hz, 12H); $^{13}$C NMR (CDCl$_3$): 194.29, 138.76, 126.77, 49.46, 46.70, 36.72, 12.46, 11.53; MS (EI, m/e): 258 (M$^+$–SC(S)NEt$_2$), 148 (SC(S)NEt$_2$)

The polymerization of thiophene-2,5-diylbismethylene N,N-diethyl dithiocarbamate is analogous to that described in example 1 $^1$H NMR (CDCl$_3$): 6.56-6.72 (br s, 1H), 6.72-6.36 (br s, 1H), 5.22-5.55 (br s, 1H), 3.81-4.12 (br, q, 2H), 3.48-3.81 (br q, 2H), 3.11-3.40 (br s, 2H), 1.01-1.37 (br t, 6H). $^{13}$C NMR (CDCl$_3$): 193.61, 140.77, 140.36, 126.15, 125.89, 52.50, 49.20, 46.73, 38.37, 12.45, 11.60.

In this example, polymerization experiments are carried out at different temperatures and with different concentrations of starting monomer. The results of these experiments are summarised in table 2.

TABLE 2

Starting monomer with structural units of formula (I) with:
Ar = 2,5-thienylene, $R_0$ = —$NR_1R_2$ with $R_1$ = $R_2$ = Et in THF.

| Conc. (M) | Polymerisation temp. (° C.) | Yield (%) | Mw (g/mol) | PD |
|---|---|---|---|---|
| 0.1 | −78 | 47 | 62800 | 2.9 |
| | −78 to 0 | 55 | 90000 | 5.3 |
| | 0 | 42 | 23800 | 3.8 |
| 0.2 | −78 | 57 | 94400 | 3.1 |
| | −78 to 0 | 56 | 66100 | 4.9 |
| 0.3 | −78 to 0 | 53 | 12800 | 1.4 |

An organic field effect transistor is then prepared according to the following procedure using the soluble precursor polymer synthesised in accordance with the method described in this embodiment. Field-effect transistors (FETs) may be made of high doped Si substrates. In this example, an isolating oxide (SiO$_2$) of 100 nm is grown thermally on one side of the Si substrate, while the backside of the substrate is covered with an Al layer which acts as a gate electrode. An organic film is then applied on top of the oxide.

This may be done by means of spin-coating a 1% w/v solution of the precursor polymer (II) in chlorobenzene. Measurements of the hole mobility are performed with FETs on which furthermore Au source and drain electrodes are evaporated after the organic film is applied. Before starting the measurement, the precursor polymer (II) in the form of a thin film is converted to the insoluble conjugated polymer poly(p-thienylene vinylene) (PTV) by heating the sample from room temperature to 185° C. at 2° C. per minute. After the sample is hold at 185° C. for 10 minutes, it is cooled back to ambient temperature.

A negative gate-voltage induces an accumulation of positive charges in a thin conducting channel on the contact surface of the organic film with the oxide. The field-effect mobilities are determined from the saturation regime of the drain-source current with the formula: $I_{ds,sat}$=$\mu_{FE}WC_{ox}(V_{gs}-V_t)^2/2$ L wherein W is the width and L the length of the conducting channel respectively, $C_{ox}$ is the capacity of the isolating SiO$_2$ layer, $V_{gs}$ is the gate voltage and $V_t$ is the threshold voltage.

A bilayer organic heterojunction solar cell is prepared according to the following procedure using the precursor polymer synthesised in accordance with the method described in this embodiment. Two ITO/PEDOT/PTV/Al devices on glass substrate were tested.

A first test is carried out with a first device wherein pristine is used an active layer. The second device is made by first converting the spin-coated precursor and afterwards spin-coating [6,6]-PCBM on top of it, thus forming a bilayer solar cell. J/V curves of the devices in dark and under illumination of 100 mW/cm$^2$ light from halogen lamp were studied. Experimental results of both devices are summarized in table 3.

TABLE 3

Starting monomer with structural units of formula (I) with:
Ar = 2,5-thienylene, $R_0$ = —$NR_1R_2$ with $R_1$ = $R_2$ = Et.

| | Pristine | Bilayer solar cell |
|---|---|---|
| $J_{sc}$ (mA/cm$^2$) | 430 | 1430 |
| $V_{oc}$ (mV) | 435 | 515 |
| FF (%) | 34 | 48.5 |
| η (%) | 0.06 | 0.36 |

Organic heterojunction solar cells are prepared according to the following procedure using the soluble precursor polymer synthesised in accordance with the method described in this embodiment. Glass substrates coated with ITO (resistance ~90 ohm per square) are first cleaned with isopropanol in an ultrasonic bath for 20 min and dried in a nitrogen flow. The samples are brought into the glove box with a nitrogen atmosphere. All following steps now are done inside the glove box. An 80 nm layer of PEDOT/PSSA is spin-coated on top of the ITO and heat treated for 10 min at 180° C. on a hot plate. Then, the sample is cooled down to room temperature and thereafter the photoactive layer, which is cast from a 0.5 wt.- % solution of precursor polymer of formula (II) mixed with a soluble C$_{60}$ derivative (PCBM) in chlorobenzene, is spincoated on top of the PEDOT/PSSA. The ratio by weight of the precursor polymer of formula (II) and PCBM is comprised between 1:0.5 and 1:4. The solution is stirred with a magnetic stirrer for 4 hours at room temperature.

The spincoating of the active layer is a two-step procedure. The first step, to determine the thickness, is done with a closed cover. The spinning speed is comprised between 250 rpm and 600 rpm and the spinning time between 1 and 5 seconds. The second step is to dry the film. This step is performed with an open cover for 3 min at 100 rpm. The converted film may have a thickness between 80 and 100 nm.

The conversion of the soluble precursor polymer, in the example given blended with PCBM, is done on a hot plate inside the glove box from room temperature up to 150° C. with a temperature step of 2° C. per minute. Then, the temperature is kept constant at 150° C. for 5 min. This is the so-called "Conversion reaction" done by heat treatment, here in thin film, in which a soluble precursor polymer is chemically converted to the related conjugated polymer, which might be soluble or insoluble, by thermal induced elimination of the leaving groups and formation of the vinylene double bonds. After that, the top electrode is evaporated in a vacuum of $2.10^{-6}$ mbar. First, a 0.7 nm thick layer of LiF and then a second layer of 150 nm aluminum are evaporated. The active area of each cell is 6 mm$^2$.

Afterwards, the sample is measured with a solar simulator (AM1.5 spectrum). Then, a post-production heat treatment, also called annealing treatment, on a hot plate took place for several times, starting with 5 min at 70° C. Then the samples are measured again at room temperature and after that annealing process again (55 min, in total 1 hour). Five annealing steps are done with a total time of 9 hours. The results are much higher after 9 hours of annealing than the initially values. The goal of the annealing treatment, which is a heat treatment done on the level of the conjugated polymer and not at the level of the precursor polymer, is not a chemical reaction induced by heat but a heat relaxation process of the conjugated polymer chains to release stress and therefore induces a transformation of the conjugated polymer chains morphology.

Example of results found for a Polymer/PCBM ratio of 1:1 with $V_{oc}$=0.41V; $J_{sc}$=3.42 mA/cm$^2$; FF=34.4%; η=0.48%.

EXAMPLE 3

A third example describes the synthesis of thiophene-2,5-diylbismethylene N,N-diethyl dithiocarbamate-3,4-diphenyl with a formula according to formula (I) wherein Ar=3,4-diphenyl 2,5-thienylene and $R_0$=—$NR_1R_2$ with $R_1$=$R_2$=$C_2H_5$ followed by polymerization to the precursor polymer with a formula according to formula (II) wherein Ar=3,4-diphenyl 2,5-thienylene and $R_3$=$R_4$=H.

For the synthesis of 3,4-Diphenylthiophene, phenylboronic acid (7.12 g, 58.394 mmol), 3,4-dibromothiophene (3.05 g, 12.603 mmol) and KF (2.92 g, 50.345 mmol) are dissolved in a mixture water and toluene 50/50 (80 mL). Pd(PPh$_3$)$_4$ (873 mg) is added as a catalyst. After refluxing the mixture for 24 hours, an extraction with CHCl$_3$ (3×50 mL) is performed and the combined organic phases are dried over MgSO$_4$. The crude reaction product is purified by column chromatography (silica, n-hexane). The yield is 75%; $^1$H NMR (CDCl$_3$): 7.30 (s, 2H), 7.25-7.21 (m, 6H), 7.19-7.16 (m, 4H); MS (EI, m/e): 236 (M$^+$)

For the synthesis of 3,4-Diphenyl-2,5-bis chloromethyl thiophene concentrated HCl (4.93 g, 50.650 mmol) and acetic anhydride (9.06 g, 88.859 mmol) are, under nitrogen atmosphere, added to paraformaldehyde (719 mg, 23.992 mmol) and 3,4-diphenylthiophene (2.1 g, 8.886 mmol) in a three-necked flask. After 4.5 hours refluxing this mixture at 70° C., 10 mL of a cold saturated aqueous solution of sodium acetate and 10 mL of a 25% aqueous solution of sodium hydroxide are added. The mixture is then extracted with CHCl$_3$ (3×50 mL) and dried over MgSO$_4$. The yield of the process is 98%. $^1$H NMR (CDCl$_3$): 7.24-7.21 (m, 6H), 7.08-7.05 (m, 4H), 4.67 (s, 4H); MS (EI, m/e): 332 (M$^+$), 297 (M$^+$−Cl), 261 (M$^+$−2 Cl)

For the synthesis of 3,4-diphenylthiophene-2,5-diylbismethylene N,N-diethyl dithiocarbamate a mixture of 3,4-diphenyl-2,5-bischloromethylthiophene (3 g, 8.890 mmol) and sodium diethyldithiocarbamate trihydrate (4.6 g, 20.448 mmol) in 10 mL of methanol is stirred for three hours at room temperature. The mixture is then extracted with CHCl$_3$ (3×50 mL), dried over MgSO$_4$ and after the solvent is evaporated, 3.5 g (70% yield) of dithiocarbamate monomer is obtained as a pink solid. $^1$H NMR (CDCl$_3$): 7.24-7.14 (m, 6H), 7.03-7.00 (m, 4H), 4.62 (s, 4H), 4.01 (q, J=7.2 Hz, 4H), 3.69 (q, J=7.2 Hz, 4H), 1.26 (2t, J =7.2 Hz, 12H). $^{13}$C NMR (CDCl$_3$): 194.22, 141.14, 135.33, 133.39, 129.99, 127.82, 126.77, 49.31, 46.63, 35.82, 12.39, 11.43.

A solution of the synthesised monomer (400 mg, 0.716 mmol) in dry THF (3.6 ml, 0.2 M) at −78° C. (or room temperature or 0° C.) is degassed for 15 minutes by passing through a continuous nitrogen flow. An equimolar LDA solution (360 μL of a 2 M solution in THF/n-hexane) is then added in one go to the stirred monomer solution. The mixture is kept at −78° C. (or room temperature or 0° C.) for 90 minutes and the passing of nitrogen is continued. After this, the solution is allowed to come to 0° C. or ethanol (6 ml) is added at −78° C. to stop the reaction (this is not necessary if the polymerization is performed at R.T or 0° C.). The polymer is precipitated in ice water (100 ml) and extracted with chloroform (3×60 ml). The solvent of the combined organic layers is evaporated under reduced pressure and a second precipitation is performed in MeOH. The precursor polymer is collected and dried in vacuum. $^1$H NMR (CDCl$_3$): 6.78-7.14 (br s, 4H), 5.00-5.30 (br s, 1H), 3.82-4.10 (br s, 2H), 3.51-3.78 (br s, 2H), 2.92-3.12 (br s, 2H), 1.04-1.34 (br t, 6H). $^{13}$C NMR (CDCl$_3$): 194.38, 138.07, 137.17, 129.35, 128.30, 56.92, 49.15, 46.68, 42.63, 12.58, 11.65.

TABLE 4

Starting monomer with structural units of formula (I) wherein Ar = 3,4-diphenyl-2,5-thienylene, $R_0$ = —$NR_1R_2$ with $R_1$ = $R_2$ = Et in THF.

| Conc. (M) | Polymerisation temp. (° C.) | Yield (%) | Mw (g/mol) in DMF | PD |
|---|---|---|---|---|
| 0.2 | 0 | 30 | 50400 | 1.4 |
|  | −78 | 60 | 29800 | 1.2 |
|  | −78 to 0 | 50 | 24600 | 1.2 |

EXAMPLE 4

In a fourth example, a co-polymerization reaction between p-xylene bis(N,N-diethyldithiocarbamate) (Formula (I) wherein Ar is a thiophene ring and $R_1$=$R_2$=$C_2H_5$ and further denoted as A) and 2,5-bis[ethoxy(thiocarbonyl)thiomethyl]thiophene (Formula (VI) wherein Ar is a thiophene ring, $R_7$=$R_8$=H and Y=Z=SC(S)OEtEt, and further denoted as B) is illustrated.

A solution of monomer p-xylene bis(N,N-diethyldithiocarbamate) (375, 250, 125 mg respectively) and monomer 2,5-bis[ethoxy(thiocarbonyl)thiomethyl]thiophene (108, 217, 325 mg respectively) in dry THF (6.16 ml, 0.2 M) at −78° C. is degassed for 1 hour by passing through a continuous nitrogen flow. An equimolar LDA solution (616 μl of a 2 M solution in THF) is added in one go to the stirred monomer solution. The mixture is kept at −78° C. for 90 minutes and the passing of nitrogen is continued. After this, ethanol (6 ml) is added at −78° C. to stop the reaction. The polymer is precipitated in ice water (100 ml) and extracted with chloroform (3×60 ml). The solvent of the combined organic layers is evaporated under reduced pressure and a second precipitation is performed in a 1/1 mixture (100 ml) of diethyl ether and hexane at 0° C. The polymer is collected and dried in vacuum.

Experiments are carried out at different ratios of A and B. The results are summarised in table 5.

TABLE 5

Starting monomer as a mixture of monomer with structural units of formula (I) wherein Ar = 2,5-thienylene, $R_0$ = —$NR_1R_2$ with $R_1$ = $R_2$ = Et, (A), and of monomer with structural units of formula (VI) wherein Ar = 2,5-thienylene, $R_7$ = $R_8$ = H and Y = Z = SC(S)OEtEt, (B)

| Molar Ratio A/B | Yield (%) | Mw (g/mol) | PD |
|---|---|---|---|
| 100/0 | 57 | 94400 | 3.1 |
| 75/25 | 56 | 372600 | 13.3 |
| 50/50 | 69 | 309900 | 12.8 |
| 25/75 | 70 | 202700 | 10.3 |
| 0/100 | 50 | 137200 | 7.8 |

EXAMPLE 5

In a fifth example, the synthesis of 2,5-bis(N,N-diethyl dithiocarbamate)-1-(3,7-dimethyloctyloxy)-4-methoxybenzene with a formula according to formula (I) wherein Ar=1-(3,7-dimethyloctyloxy)-4-methoxy-2,5-phenylene, $R_0$=—$NR_1R_2$, $R_1$=$R_2$=$C_2H_5$, followed by the polymerization to the soluble precursor polymer with a formula according to formula (II) wherein Ar=1-(3,7-dimethyloctyloxy)-4-methoxy-2,5-phenylene, $R_3$=$R_4$=H, is illustrated.

To 50 ml of an ethanol solution of 2,5-bis(chloromethyl)-1-(3,7-diemthyloxtyloxy)-4-methoxybenzene (5 g, 13.889 mmol), diethyl dithiocarbamic acid sodium salt trihydrate (7.19 g, 31.944 mmol) is added as a solid, after which the mixture is stirred at ambient temperature for three hours. Then, water is added and the desired monomer is extracted with ether (3×100 ml) and dried over $MgSO_4$. Evaporation of the solvents yields 92% of the pure product as a white solid. $^1$H NMR ($CDCl_3$): 6.99 (s, 2H), 4.52 (s, 2H), 4.48 (s, 2H), 3.95 (m, 4H+2H), 3.74 (s, 3H), 3.64 (m, 4H), 1.60-1.85 (m, 2H), 1.38-1.58 (m, 2H), 1.21 (t, 12H), 1.05-1.30 (m, 6H), 0.88 (d, 3H), 0.81 (d, 6H); $^{13}$C NMR ($CDCl_3$): 196.11, 195.99, 151.27, 150.90, 125.08, 124.42, 114.75, 113.86, 67.13, 56.19, 49.41, 49.34, 46.61, 39.22, 37.32, 36.83, 36.30, 29.79, 27.95, 24.69, 22.69, 22.59, 19.62, 12.42, 11.59

The polymerization reaction is analogous to that described in example 1. Polymerization experiments are carried out at different temperatures. The results are summarised in table 6.

TABLE 6

Starting monomer with structural units of formula (I) wherein Ar = 1-(3,7-dimethyloctyloxy)-4-methoxy-2,5-phenylene, $R_0$ = —$NR_1R_2$ with $R_1$ = $R_2$ = $C_2H_5$ in THF

| Polymerisation temperature | Yield (%) | Mw (g/mol) (in DMF) | PD (in DMF) |
|---|---|---|---|
| −78° C. | 54 | 3800 | 1.0 |
| Room temperature | 59 | 14900 | 2.8 |
|  | 69 | 18400 | 2.9 |
| 35° C. | 62 | 18900 | 2.9 |
| 65° C. | 39 | 37100 | 1.4 |

EXAMPLE 6

A sixth example describes the synthesis of pyridine-2,5-diylbismethylene N,N-diethyl dithiocarbamate with a formula according to formula (I) wherein Ar=2,5-pyridine, $R_0$=—$NR_1R_2$, $R_1$=$R_2$=$C_2H_5$, followed by the polymerization to the soluble precursor polymer with a formula according to formula (II) wherein Ar=2,5-pyridine, $R_3$=$R_4$=H.

The yield of the reaction is 82%. $^1$H NMR ($CDCl_3$): 8.54 (d, 1H), 7.86 (d, 1H), 7.63 (d, 1H), 4.88 (s, 2H), 4.56 (s, 2H), 4.00 (q, 4H), 3.72 (q, 4H), 1.36 (2t, 12H); MS (EI, m/e): 401 ($M^+$), 285 ($M^+$–C(S)$NEt_2$), 148 (SC(S)$NEt_2$), 116 (C(S)$NEt_2$).

The polymerization reaction is analogous to that described in example 1. Polymerization experiments are carried out at room temperature and 35° C. The results are summarised in table 7.

TABLE 7

Starting monomer with structural units of formula (I) wherein Ar = 2,5-pyridine, $R_0$ = —$NR_1R_2$ with $R_1$ = $R_2$ = $C_2H_5$ in THF

| Polymerisation temperature | Yield (%) | Mw (g/mol) (in DMF) | PD (in DMF) |
|---|---|---|---|
| Room temperature | 43 | 14800 | 2.0 |
| 35° C. | 40 | 15800 | 2.1 |

EXAMPLE 7

In a seventh example, the synthesis of 1,4-bis{2-[2-(2-methoxy-ethoxy)ethoxy]ethoxy}-2,5-diylbismethylene N,N-diethyl dithiocarbamate with a formula according to formula (I) wherein Ar=1,4-bis-(2-(2-(2-methoxy-ethoxy)-ethoxy)-ethoxy)-benzene, $R_0$=—$NR_1R_2$, $R_1$=$R_2$=$C_2H_5$, followed by the polymerization to the soluble precursor polymer with a formula according to formula (II) wherein Ar=1,4-bis-(2-(2-(2-methoxy-ethoxy)-ethoxy)-ethoxy)-benzene, $R_3$=$R_4$=H.

The yield of the reaction is 75%. $^1$H NMR ($CDCl_3$): 7.01 (s, 2H), 4.54 (s, 4H), 4.09 (t, 4H), 3.81 (t, 4H), 3.60-3.76 (m,. 20H), 3.53 (m, 4H), 3.36 (s, 6H), 1.25 (t, 12H); $^{13}$C NMR ($CDCl_3$): 195.80, 150.73, 125.30, 115.22, 71.84, 70.83, 70.63, 70.47, 69.69, 68.81, 58.95, 49.38, 46.56, 36.48, 12.41, 11.57; DIP MS (Cl, m/e): 725 ($M^+$), 576 ($M^+$–SC(S)$NEt_2$).

The polymerization reaction is analogous to that described in example 1 $^1$H NMR ($CDCl_3$): 6.69-6.87 (br s, 2H), 5.56-5.76 (br s, 1H), 3.42-4.13 (mm, 28H), 1.00-1.34 (br t, 6H)

TABLE 8

Starting monomer with structural units of formula (I) wherein Ar = 1,4-bis(2-(2-(2-methoxy-ethoxy)ethoxy)-ethoxy)-benzene, $R_0$ = —$NR_1R_2$ with $R_1$ = $R_2$ = $C_2H_5$ in THF

| Polymerisation temperature | Yield (%) | Mw (g/mol) (in DMF) | PD (in DMF) |
|---|---|---|---|
| Room temperature | 59 | 14900 | 2.8 |

EXAMPLE 8

In an eighth example, the synthesis of 3,4-dichlorothiophene-2,5-diylbismethylene N,N-diethyl dithiocarbamate with a formula according to formula (I) wherein Ar=3,4-dichloro-2,5-thienylene, $R_0$=—$NR_1R_2$, $R_1$=$R_2$=$C_2H_5$, followed by the polymerization to the soluble precursor polymer with a formula according to formula (II) wherein Ar=3,4-dichloro-2,5-thienylene, $R_3=R_4=H$, is illustrated.

The yield of the reaction is 94%; $^1$H NMR (CDCl$_3$): 4.71 (s, 4H), 4.00 (q, J=7.2 Hz, 4H), 3.69 (q, J=7.2 Hz, 4H), 1.26 (t, J=7.2 Hz, 12H); $^{13}$C NMR (CDCl$_3$): 193.58, 131.67, 122.65, 49.80, 46.84, 34.50, 12.52, 11.53; MS (EI, m/e): 326 (M$^+$–SC(S)NEt$_2$), 178 (M$^+$–2 SC(S)NEt$_2$), 148 (SC(S)NEt$_2$), 116 (C(S)NEt$_2$), 72 (NEt$_2$).

The polymerization reaction is analogous to that described in example 1 $^1$H NMR (CDCl$_3$): 5.50-5.80 (br s, 1 H), 3.85-4.08 (br q, 2H), 3.63-3.83 (br q, 2H), 3.32-3.51 (br s, 2H), 1.14-1.36 (br t, 6H)

In this example, polymerization experiments are carried out at room temperature and 35° C. The results are summarised in table 9.

TABLE 9

Starting monomer with structural units of formula (I) wherein Ar = 3,4-dichloro-2,5thienylene, $R_0$ = —NR$_1$R$_2$ with $R_1$ = $R_2$ = $C_2H_5$ in THF

| Polymerisation temperature | Yield (%) | Mw (g/mol) (in DMF) | PD (in DMF) |
|---|---|---|---|
| Room temperature | 64 | 10400 | 1.8 |
| 35° C. | 76 | 18500 | 2.8 |

EXAMPLE 9

In an ninth example, the synthesis of naphthalene-1,4-diylbismethylene N,N-diethyl dithiocarbamate with a formula according to formula (I) wherein Ar =1,4-naphthalene, $R_0$=—NR$_1$R$_2$, $R_1$=$R_2$=$C_2H_5$, followed by the polymerization to the soluble precursor polymer with a formula according to formula (II) wherein Ar=1,4-naphthalene, $R_3=R_4=H$, is illustrated. The yield of the reaction is 89%; $^1$H NMR (CDCl$_3$): 8.10, (q, 2H), 7.585 (q, 2H), 7.51 (s, 2H), 4.94 (s, 4H), 4.05 (q, J=7.2 Hz, 4H), 3.66 (q, J=7.2 Hz, 4H), 1.29 (2t, J=7.2 Hz, 6H), 1.21 (2t, J=7.2 Hz, 6H); $^{13}$C NMR (CDCl$_3$): 195.10, 132.21, 131.96, 127.93, 126.40, 124.86, 49.41, 46.70, 40.48, 12.42, 11.61; DIP MS (EI, m/e): 302 (M$^+$–SC(S)NEt$_2$), 148 (SC(S)NEt$_2$), 116 (C(S)NEt$_2$). The polymerization reaction is analogous to that described in example 1.

Polymerization experiments are carried out at room temperature and 35° C.

The results are summarised in table 10.

TABLE 10

Starting monomer with structural units of formula (I) wherein Ar = 1,4-naphtalene, $R_0$ = —NR$_1$R$_2$ with $R_1$ = $R_2$ = $C_2H_5$ in THF

| Polymerisation temperature | Yield (%) | Mw (g/mol) (in DMF) | PD (in DMF) |
|---|---|---|---|
| Room temperature | 80 | 14600 | 1.5 |
| 35° C. | 78 | 15900 | 1.7 |

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method for the preparation of a precursor polymer having the general formula:

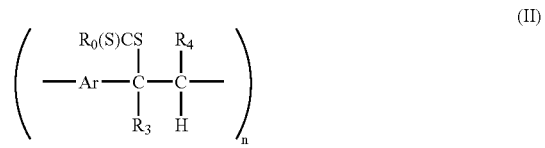

wherein Ar is an aromatic divalent group or a heteroaromatic divalent group, wherein $R_0$ is selected from the group consisting of an amino group —NR$_1$R$_2$, an aryloxy group, an alkyl group, an aryl group, an alkylaryl group, an arylalkyl group, a thioether group, an ester group and an acid carboxylic group, and wherein $R_3$ and $R_4$ are independently from each other hydrogen or an organic group selected from the group consisting of a $C_1$-$C_{20}$-alkyl group, a cyclic $C_3$-$C_{20}$-alkyl group, aryl groups, alkylaryl groups, arylalkyl groups aid heterocyclic groups, said method comprising the steps of:
providing a monomer having the general formula:

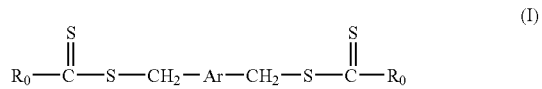

wherein Ar is an aromatic divalent group or an heteroaromatic divalent group, wherein $R_0$ is selected from the group consisting of an amino group —NR$_1$R$_2$, an aryloxy group, an alkyl group, an aryl group, an alkylaryl group, an arylalkyl group, a thioether group, an ester group, and an acid carboxylic group, wherein $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, and wherein $R_1$ and $R_2$ may be linked together to form a cycle; and reacting said monomer with a basic compound in the presence of an organic solvent to obtain said precursor polymer, wherein an amount of said basic compound is from 1 to 2 equivalents with respect to the monomer.

2. A method according to claim 1, wherein providing a monomer is performed by providing a monomer with general formula (I) wherein $R_0$ is an amino group —NR$_1$R$_2$.

3. A method according to claim 1, wherein $R_0$ is an amino group —NR$_1$R$_2$. and wherein $R_1$ and $R_2$ are independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group.

4. A method according to claim 1, wherein $R_0$ is an amino group —NR$_1$R$_2$, and wherein $R_1$ and $R_2$ are independently selected from the group consisting of a methyl group, an ethyl group, an isopropyl group, a phenyl group and a benzyl group.

5. A method according to claim 1 wherein said basic compound is selected from the group consisting of a metal hydride, a metal alkoxide, a metal hydroxide, a metal amide, a metal amine, an organometal compound wherein the metal is an alkali metal or alkali earth metal, a grignard reagent, ammonium hydroxide, pyridine and phosphazene bases.

6. A method according to claim 1, wherein the concentration of monomer (I) is between 0.1 M and 0.3 M.

7. A method according to claim 1, wherein the Ar is an aromatic divalent group with 4 to 20 carbon atoms which may be substituted with one or more substituents independently selected from the group consisting of $C_1$-$C_{20}$-alkyl, $C_3$-$C_{20}$-alkoxy, $C_1$-$C_{20}$-alkylsulfate, selected from the group consisting of oxygen, sulphur, and nitrogen in the aromatic divalent group.

8. A method according to claim 1, wherein said aromatic or heteroaromatic divalent group is selected from the group consisting of 1,4-phenylene; 2,6-naphthalenediyl; 1,4-naphthalenediyl; 1,4-antbracenediyl; 2,6-anthracenediyl; 9,10-anthracenediyl; 2,5-thienylene; 2,4-thienylene; 2,3-thienylene; 2,5-furanedlyl; 2,5-pyrroledlyl; 1,3,4-oxadiazole-2,5-diyl; 1,3,4-thiadiazole-2,5-diyl; 2,5benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-bi-phenylene; phenantrene-2,7-diyl; 9,10-dihydro-phenantrene-2,7-diyl; dibenzofurane-2,7-diyl; dibenzothiophene-2,7-diyl.

9. A method according to claim 8, wherein said aromatic or heteroaromatic divalent group is 1,4-phenylene or 2,5-thienylene.

10. A method according to claim 9, wherein said aromatic or heteroaromatic divalent group is 2,5 thienylene.

11. A method according to claim 4, wherein $R_1$ and $R_2$ are independently from each other selected from the group consisting of methyl, ethyl and isopropyl.

12. A method according to claim 1, wherein said organic solvent is an aprotic solvent.

13. A method according to claim 1, wherein said reacting step is performed at a temperature between −78° C. and 200° C.

14. A method according to claim 1, wherein said reacting step is performed at a temperature between −20° C. and 30° C.

* * * * *